US011908496B2

(12) United States Patent
Le et al.

(10) Patent No.: US 11,908,496 B2
(45) Date of Patent: *Feb. 20, 2024

(54) BISBX (012) LAYERS HAVING INCREASED OPERATING TEMPERATURES FOR SOT AND MRAM DEVICES

(71) Applicant: Western Digital Technologies, Inc., San Jose, CA (US)

(72) Inventors: Quang Le, San Jose, CA (US); Brian R. York, San Jose, CA (US); Cherngye Hwang, San Jose, CA (US); Susumu Okamura, San Jose, CA (US); Xiaoyong Liu, San Jose, CA (US); Kuok San Ho, Emerald Hills, CA (US); Hisashi Takano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/082,721

(22) Filed: Dec. 16, 2022

(65) Prior Publication Data

US 2023/0121375 A1 Apr. 20, 2023

Related U.S. Application Data

(63) Continuation of application No. 17/405,954, filed on Aug. 18, 2021, now Pat. No. 11,532,323.

(51) Int. Cl.
*G11B 5/39* (2006.01)
*H01F 10/32* (2006.01)
(Continued)

(52) U.S. Cl.
CPC ............ *G11B 5/3909* (2013.01); *G11B 5/313* (2013.01); *G11B 5/314* (2013.01); *G11C 11/161* (2013.01);
(Continued)

(58) Field of Classification Search
CPC ....... G11B 5/3909; G11B 5/313; G11B 5/314; G11B 5/39; G11C 11/161; H01F 10/3254;
(Continued)

(56) References Cited

U.S. PATENT DOCUMENTS 5,751,521 A 5/1998 Gill
6,657,823 B2 12/2003 Kawato
(Continued)

FOREIGN PATENT DOCUMENTS

JP 4934582 B2 5/2012
JP 2021057357 A 4/2021
(Continued)

OTHER PUBLICATIONS

Khang et al. "A conductive topological insulator with large spin Hall effect for ultralow power spin-orbit torque switching," Nature Materials, vol. 17, pp. 808-813, Sep. 2018, pp. 808-813, https://doi.org/10.1038/s41563-018-0137-y.
(Continued)

*Primary Examiner* — Brian E Miller
(74) *Attorney, Agent, or Firm* — PATTERSON + SHERIDAN, LLP; Steven H. VerSteeg

(57) ABSTRACT

The present disclosure generally relate to spin-orbit torque (SOT) devices comprising a topological insulator (TI) modulation layer. The TI modulation layer comprises a plurality of bismuth or bismuth-rich composition modulation layers, a plurality of TI lamellae layers comprising BiSb having a (012) crystal orientation, and a plurality of texturing layers. The TI lamellae layers comprise dopants or clusters of atoms, the clusters of atoms comprising a carbide, a nitride, an oxide, or a composite ceramic material. The clusters of atoms are configured to have a grain boundary glass forming temperature of less than about 400° C. Doping the TI lamellae layers comprising BiSb having a (012)
(Continued)

crystal orientation with clusters of atoms comprising a carbide, a nitride, an oxide, or a composite ceramic material enable the SOT MTJ device to operate at higher temperatures while inhibiting migration of Sb from the BiSb of the TI lamellae layers.

25 Claims, 15 Drawing Sheets

(51) Int. Cl.
  H10B 61/00    (2023.01)
  G11C 11/16    (2006.01)
  G11B 5/31     (2006.01)
  H10N 50/85    (2023.01)
  H10N 52/00    (2023.01)
  H10N 52/80    (2023.01)

(52) U.S. Cl.
  CPC ....... *H01F 10/329* (2013.01); *H01F 10/3254* (2013.01); *H10B 61/00* (2023.02); *H10N 50/85* (2023.02); *H10N 52/00* (2023.02); *H10N 52/80* (2023.02); G11B 5/39 (2013.01)

(58) Field of Classification Search
  CPC ...... H01F 10/329; H10B 61/00; H10N 50/85; H10N 52/00; H10N 52/80; H10N 50/10
  See application file for complete search history.

(56) References Cited

U.S. PATENT DOCUMENTS

| | | |
|---|---|---|
| 6,667,861 B2 | 12/2003 | Gill |
| 6,680,828 B2 | 1/2004 | Gill |
| 6,906,898 B2 | 6/2005 | Kawato |
| 7,016,160 B2 | 3/2006 | Mao et al. |
| 7,242,556 B2 | 7/2007 | Gill |
| 7,298,595 B2 | 11/2007 | Gill |
| 7,436,632 B2 | 10/2008 | Li et al. |
| 7,643,255 B2 | 1/2010 | Gill et al. |
| 7,697,242 B2 | 4/2010 | Gill |
| 7,881,018 B2 | 2/2011 | Gill et al. |
| 8,125,746 B2 | 2/2012 | Dimitrov et al. |
| 8,174,799 B2 | 5/2012 | Hoshiya et al. |
| 8,223,464 B2 | 7/2012 | Yasui et al. |
| 8,553,346 B2 | 10/2013 | Braganca et al. |
| 8,570,677 B2 | 10/2013 | Braganca et al. |
| 8,570,689 B2 | 10/2013 | Sato et al. |
| 8,654,465 B2 | 2/2014 | Braganca et al. |
| 9,472,216 B1 | 10/2016 | Mauri et al. |
| 9,806,710 B2 | 10/2017 | Flatte |
| 9,929,210 B2 | 3/2018 | Lai et al. |
| 9,947,347 B1 | 4/2018 | Van Der Heijden et al. |
| 10,014,012 B1 | 7/2018 | Song et al. |
| 10,127,933 B2 | 11/2018 | Batra et al. |
| 10,210,888 B1 | 2/2019 | Li et al. |
| 10,483,457 B1 | 11/2019 | Lee et al. |
| 10,490,731 B2 | 11/2019 | Sasaki et al. |
| 10,720,570 B2 | 7/2020 | Le et al. |
| 10,839,831 B1 | 11/2020 | Nguyen et al. |
| 10,991,390 B2 | 4/2021 | Kobayashi |
| 11,088,200 B1 | 8/2021 | Xiao |
| 11,094,338 B1 | 8/2021 | Hwang et al. |
| 11,100,946 B1 | 8/2021 | Le et al. |
| 11,222,656 B1 | 1/2022 | Le et al. |
| 11,495,741 B2* | 11/2022 | York ............ H10N 52/00 |
| 11,532,323 B1* | 12/2022 | Le ............ H10B 61/00 |
| 2014/0226239 A1 | 8/2014 | Mihajlovic et al. |
| 2014/0254252 A1 | 9/2014 | Guo |
| 2015/0041934 A1 | 2/2015 | Khvalkovskiy et al. |
| 2015/0287426 A1 | 10/2015 | Mihajlovic et al. |
| 2017/0077392 A1 | 3/2017 | Han et al. |
| 2017/0098545 A1 | 4/2017 | Woodruff |
| 2017/0221506 A1 | 8/2017 | Tan et al. |
| 2017/0271581 A1 | 9/2017 | Seong et al. |
| 2017/0288666 A1 | 10/2017 | Flatte |
| 2018/0166500 A1 | 6/2018 | Wang et al. |
| 2018/0358543 A1 | 12/2018 | Le et al. |
| 2018/0366172 A1 | 12/2018 | Wang et al. |
| 2019/0037703 A1 | 1/2019 | Wang et al. |
| 2019/0058113 A1 | 2/2019 | Ramaswamy et al. |
| 2019/0392881 A1 | 12/2019 | Rakshit et al. |
| 2020/0035910 A1 | 1/2020 | Li et al. |
| 2020/0176511 A1 | 6/2020 | Park et al. |
| 2020/0243603 A1 | 7/2020 | Lee et al. |
| 2020/0243752 A1 | 7/2020 | Sasaki |
| 2020/0279992 A1 | 9/2020 | Pham et al. |
| 2021/0056988 A1 | 2/2021 | Chen et al. |
| 2021/0249038 A1* | 8/2021 | Le ............ H10B 61/00 |
| 2021/0336127 A1* | 10/2021 | Le ............ H01F 10/329 |
| 2021/0367142 A1 | 11/2021 | Lee et al. |
| 2021/0408370 A1* | 12/2021 | York ............ H10N 50/10 |
| 2022/0005498 A1 | 1/2022 | Le et al. |
| 2022/0013138 A1 | 1/2022 | Hwang et al. |
| 2022/0068538 A1 | 3/2022 | Apalkov et al. |
| 2022/0069202 A1 | 3/2022 | Nguyen et al. |
| 2022/0310901 A1* | 9/2022 | Oguz ............ H10N 50/80 |
| 2023/0047223 A1* | 2/2023 | Le ............ H10N 52/80 |
| 2023/0121375 A1* | 4/2023 | Le ............ H10N 52/00 360/324.2 |
| 2023/0197132 A1* | 6/2023 | Le ............ H10N 52/80 365/158 |

FOREIGN PATENT DOCUMENTS

| | | |
|---|---|---|
| WO | 2018231292 A1 | 12/2018 |
| WO | 2019054484 A1 | 3/2019 |
| WO | 2019125388 A1 | 6/2019 |
| WO | 2019159885 A1 | 8/2019 |

OTHER PUBLICATIONS

Roschewsky et al. "Spin-orbit torque and Nernst effect in Bi—Sb/Co heterostructures," Physical Review, vol. B 99, No. 195103, 2019, pp. 195103-1-195103-5, DOI: 10.1103/PhysRevB.99.195103.

Walker et al. "Composition-dependent structural transition in epitaxial Bi1—xSbx thin films on Si (111)," Physical Review Materials, vol. 3, 064201, Jun. 7, 2019, 8 pages.

Eustathopoulos "Wetting by Liquid Metals-Application in Materials Processing: The Contribution of the Grenoble Group," Metals, 2015, vol. 5, No. 1, pp. 350-370, doi:10.3390/met5010350.

Frolov et al. "Structural phase transformations in metallic grain boundaries," Nature Communications, 2013, vol. 4, No. 1899, pp. 1-7, DOI: 10.1038/ncomms2919.

Berry et al. "Melting at dislocations and grain boundaries: A phase field crystal study," Physical Review, vol. B 77, No. 224114, 2008, pp. 224114-1-224114-5, DOI: 10.1103/PhysRevB.77.224114.

Kogtenkova et al. "Grain Boundary Complexions and Phase Transformations in Al- and Cu-Based Alloys," Metals, 2019, vol. 9, No. 1, doi:10.3390/met9010010, 24 pages.

Buffat et al. "Size effect on the melting temperature of gold particles," Physical Review A, vol. 13, No. 6, Jun. 1976, pp. 2287-2298.

Cantwell et al. "Grain boundary complexions," ScienceDirect, Acta Materialia, vol. 62, No. 152, 2014, pp. 1-48, http://dx.doi.org/10.1016/j.actamat.2013.07.037.

Tanaka et al. "Thermodynamic Evaluation of Nano-Particle Binary Alloy Phase Diagrams," 2001, Zeitschrift für Metallkunde, vol. 92, No. 11, pp. 1236-1241, http: //hdl.handle.net/11094/26514.

Chi et al. "The Spin Hall Effect of Bi—Sb Alloys Driven by Thermally Excited Dirac-like Electronics," Oct. 28, 2019, ArXiv: 1910, 40 pages, https://arxiv.org/pdf/1910.12433.pdf.

Shirokura et al. "Origin of the Giant Spin Hall Effect in BiSb Topological Insulator," ArXiv:1810; 27 pages, https://arxiv.org/ftp/arxiv/papers/1810/1810.10840.pdf.

Shao "Spin-Orbit Torques in Topological Insultators," UCLA Electronic Theses and Dissertations; 2015; 76 pages, https://escholarship.

(56) References Cited

OTHER PUBLICATIONS org/content/qt3ds9792s/qt3ds9792s.pdf?t=nys1b5&nosplash=32ac004cc5750a361e60ece735dd2752.
Yao et al. "Influence of Crystal Orientation and Surface Termination on the Growth of BiSb thin films on GaAs Substrates," Accepted Manuscript, Journal of Crystal Growth, 2019, 24 pages, doi: https://doi.org/10.1016/j.icrysgro.2019.01.041.
International Search Report and the Written Opinion for International Application No. PCT/US2020/065156 dated Mar. 14, 2021, 13 pages.
International Search Report and the Written Opinion for International Application No. PCT/US2020/066902 dated Apr. 18, 2021, 12 pages.
Fan et al. "Magnetization switching through giant spin-orbit torque in a magnetically doped topological insulator heterostructure," Nature Materials, vol. 13, Apr. 28, 2014, pp. 669-704, <<https://doi.org/10.1038/nmat3973>>.
Roschewsky et al. "Spin-Orbit Torque and Nemst Effect in BiSb/ Co Heterostructures," Center for Energy Efficient Electronics Science, University of California—Berkeley, 2018, 12 pages, https://e3s-center.berkeley.edu/wp-content/uploads/2018/11/43Theme-4_Roschewsky_2018E3Sretreat.pdf.
U.S. Appl. No. 17/401,856, filed Aug. 13, 2021.
U.S. Appl. No. 17/405,954, filed Aug. 18, 2021.
Teague "X-ray and Mossbauer spectroscopy studies of the silicon-antimony and bismuth-antimony alloys," 1971, Scholar's Mine, Doctoral Dissertations, University of Missouri—Rolla, 167 pages.
"A colossal breakthrough for topological spintronics," Tokyo Institute of Technology, Jul. 31, 2018, 4 pages, <https://www.titech.ac.jp/english/news/2018/042001.html>.
International Search Report and the Written Opinion for International Application No. PCT/US2021/033912 dated Jul. 25, 2021, 9 pages.

Lau et al. "Spin-orbit torque switching without an external field using interlayer exchange coupling," Nature Nanotechnology, vol. 11, Sep. 2016, pp. 758-762, <https://doi.org/10.1038/nnano.2016.84>.
Liu "Spin-orbit Torque Driven Magnetization Switching for Nonvolatile Memory and Beyond," Carnegie Mellon University, May 2020, Thesis, 157 pages, <https://doi.org/10.1184/R1/11933571.v1>, <https://kilthub.cmu.edu/articles/Spinorbit_Torque_Driven_Magnetization_Switching_for_Nonvolatile_Memory_and_Beyond/11933571/files/21908046.pdf>.
Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011.2169946.
International Search Report and the Written Opinion for International Application No. PCT/US2021/033197 dated Jul. 12, 2021, 9 pages.
Kotb et al. "Study of spin transfer torque (STT) and spin orbit torque (SOT) magnetic tunnel junctions (MTJs) at advanced CMOS technology nodes," Electrical and Electronics Engineering: An International Journal, (ELELIJ) vol. 6, No. 1, Feb. 2017, pp. 1-9, 10.14810/elelij.2017.6101.
Yuan et al. "Readback Resolution of Differential Dual CPP Spin Valve Reader," IEEE Transactions on Magnetics, vol. 46, No. 6, Jun. 2010, pp. 1667-1670, 10.1109/TMAG.2010.2045106.
Tuo Fan et al. "Ultrahigh Efficient Spin-Orbit Torque Magnetization Switching in All-Sputtered Topological Insulator—Ferromagnet Multilayer", Jul. 5, 2020, <https://arxiv.org/ftp/arxiv/papers/2007/2007.02264.pdf.
International Search Report and Written Opinion for International Application No. PCT/US2022/027960 dated Sep. 5, 2022.

\* cited by examiner

412 BiSb Lamellae
406 Dopant X Lamellae

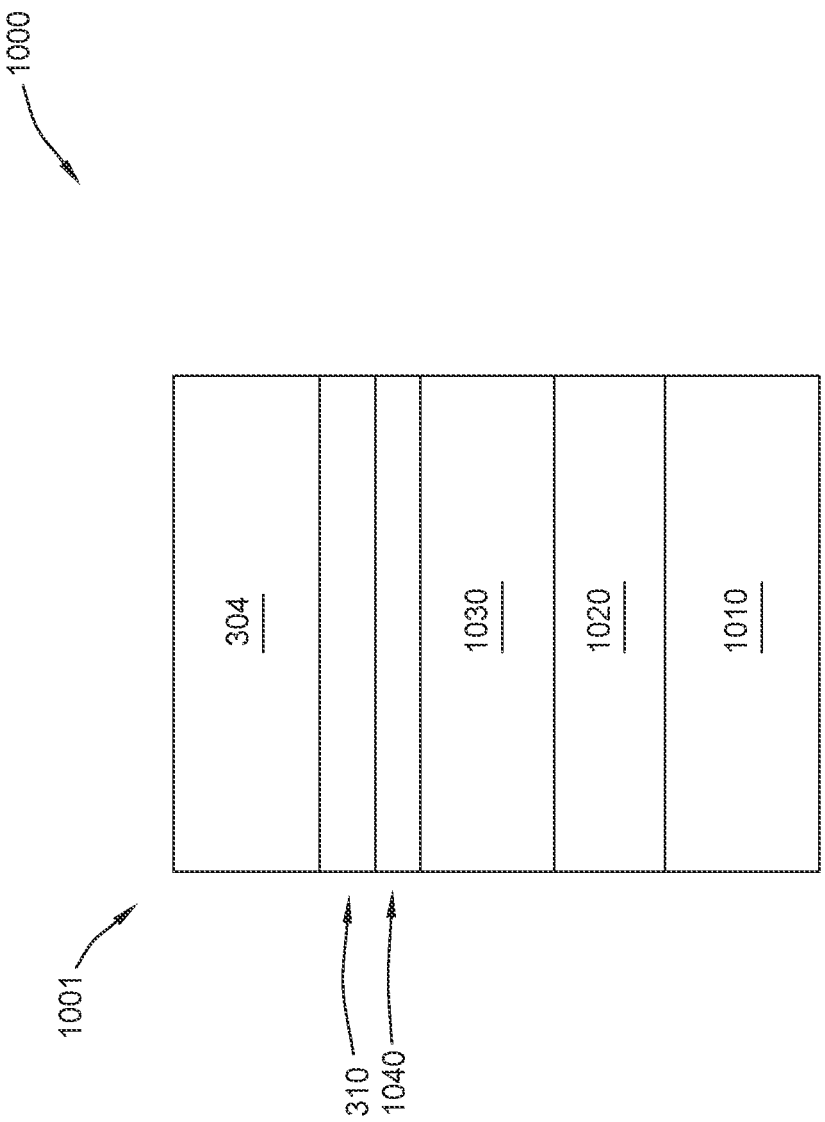

BISBX (012) LAYERS HAVING INCREASED OPERATING TEMPERATURES FOR SOT AND MRAM DEVICES

CROSS-REFERENCE TO RELATED APPLICATIONS

This application is a continuation of co-pending U.S. patent application Ser. No. 17/405,954, filed Aug. 18, 2021. The aforementioned related patent applications is herein incorporated by reference.

BACKGROUND OF THE DISCLOSURE

Field of the Disclosure

Embodiments of the present disclosure generally relate to a buffer layer and an interlayer that inhibit antimony (Sb) migration within a bismuth antimony (BiSb) layer having a (012) orientation.

Description of the Related Art

Topological insulators (Tis) are materials that behave as insulators in their interiors but have a surface containing conductive states. BiSb is an exemplary TI, and it has been proposed as a spin Hall layer for spin torque oscillator (STO) and magnetoresistive random access memory (MRAM) devices. BiSb is a narrow gap topological insulator with both giant spin Hall effect and high electrical conductivity.

N. H. D. Khang, Y. Ueda, and P.N. Hai, "A conductive topological insulator with large spin Hall effect for ultralow power spin—orbit torque switching," Nature Materials, v. 17, 808 (2018), discovered that BiSb with a (012) crystallographic orientation has a high spin Hall angle and high conductivity in comparison to BiSb with a (001) crystallographic orientation. BiSb with a (012) crystallographic orientation was formed on a MnGa film with a (001) crystallographic orientation which was formed on a GaAs substrate with a (001) crystallographic orientation.

N. Roschewsky, E. S. Walker, P. Gowtham, S. Muschinske, F. Hellman, S.R. Bank, and S. Salahuddin, "Spin-orbit torque and Nernst effect in Bi-Sb/Co heterostructures", Phys. Rev. B, vol. 99, 195103 (2 May 2019), recognized that BiSb growth, crystallographic orientation, spin Hall angle, and high conductivity had poor consistency among experiments.

E. S. Walker, S. Muschinske, C. J. Brennan, S. R. Na, T. Trivedi, S. D. March, Y. Sun, T. Yang, A. Yau, D. Jung, A. F. Briggs, E.M. Krivoy, M. L. Lee, K. M. Liechti, E. T. Yu, D. Akinwande, and S. R. Bank, "Composition-dependent structural transition in epitaxial Bi1-xSbx thin films on Si (111)", Phys. Rev. Materials 3, 064201 (7 Jun. 2019), grew BiSb alloy films with a (012) orientation over an Si (111), as well as (012) textured ultra-thin films of pure Bi<20 Å on Si(111) substrate.

N. Eustathopoulos, "Wetting by Liquid Metals—Application in Materials Processing: The Contribution of the Grenoble Group", Metals 2015, 5(1), 350-370, recognized that liquid metals generally wet carbides, nitrides, borides, and oxides materials of transition metals that have low band gaps or are somewhat conductive with high covalently bonded cohesion. This wetting behavior is expected at the interfaces of such low band gap or conductive ceramics and low melting point BiSbX liquid alloys near or above their melting temperature (Tm), or around the boundaries of nanoparticles of low band gap or conductive ceramic layers of oxides, carbides, and nitrides in a liquid metal BiSbX matrix near or above its Tm.

T. Frolov, D. Olmsted, M. Asta, and Y. Mishin., "Structural phase transformations in metallic grain boundaries", Nature Communications, vol. 4, 1899 (2013), found using molecular dynamic simulations that the grain boundary (GB) accumulates dislocations (lattice defects) as a function of annealing temperature and that the GB increases in width with temperature and premelt with complete wetting of the GB well below the melting temperature. Thus, thicker or wider grain boundaries of glass forming materials creates more grain isolation and increased resistance to Sb or Bi or general metal migration across the GB, allowing higher temperatures to be utilized.

J. Berry, K. R. Elder, and M. Grant, "Molecular Dynamic Simulation Literature such as: A phase field crystal study", Phys Rev. B, 77, 224114, 2008; Melting at dislocations and grain boundaries, and that pre-melting of dislocations and other defects with complete wetting of the grain boundaries happens well below the bulk melting temperature Tm. O. Kogtenkova, B. Straumal, A. Korneva, T. Czeppe, A. Wierzbicka-Miernik, M. Faryna, and P Zięba, "Grain Boundary Complexions and Phase Transformations in Al- and Cu-based Alloys", Metals, 2019, 9(1), 10., showed NiCu grain boundary pre-melting and wetting occurs more than 600° C. below Tm.

P. Buffat, and J-P. Borel, "Size effect on the melting temperature of gold particles", Phys Rev. A, Vol. 13, Num. 6, 1976, 2287-2298, was the first to show that nanoparticles of Au could melt around 1000° C. below bulk Au Tm (for nanoparticle sizes of about 10 Å, and around 600° C. for nanoparticle sizes of about 20 Å). P. R. Cantwell, M. Tang, S. J. Dillon, J. Luo, G. S. Rohrer, and, M. P. Harmer, "Grain boundary complexions", Acta Materialia, 62, (2014), 1-48, was a review article on the size dependent of surface and interface melting, nanoparticle melting and dislocation pre-melting and complete grain boundary wetting all well below bulk Tm values. Tanaka T, Hara S. Z, Metallkd 2001; 92:1236, showed BiCu binary alloy nanoparlicle solidus-liquidous lines are also size dependent showing melting around 600° C. below the alloys bulk Tm.

One skilled in the art of thin film depositions is able to co-deposit primarily atom clusters of highly cohesive oxide, carbide, and nitride ceramics with metal alloys. Such ceramic atom clusters still retain some cohesion and can be imbedded as atom clusters into a metal matrix. From the prior art noted above, small atom clusters behave as small nanoparticles. If the ceramic clusters are from materials that exhibit low band gaps or metallic bonding, or are conductive, the boundaries of these clusters can be wetted by liquid metals like BiSbX alloys near or above the melting point of the cluster. These atom clusters will coalesce into grain boundaries (GBs), and given the small size of the atom clusters, can melt well below their bulk Tm to form amorphous glasses at the GB, in some cases around 1000° C. below the ceramics original bulk Tm. Temperatures near or above the melting point will widen the GB providing better resistance to Bi and Sb migration through the GB. Thus, ceramics with bulk Tm's around 1400° C. can melt at the GB and form glasses around 400° C., which is well above the melting temperature of BiSbX alloys but within the process temperatures needed for MRAM devices.

Therefore, there is a need for improved process temperatures of low melting point topological insulators (TIs) like BiSbX alloys having a high spin Hall angle and high conductivity, as well as for improved devices having a TI layer with a high spin Hall angle and high conductivity.

SUMMARY OF THE DISCLOSURE

The present disclosure generally relate to spin-orbit torque (SOT) magnetic tunnel junction (MTJ) devices comprising a topological insulator (TI) modulation layer. The TI modulation layer comprises a plurality of bismuth or bismuth-rich composition modulation layers, a plurality of TI lamellae layers comprising BiSb having a (012) crystal orientation, and a plurality of texturing layers. The TI lamellae layers comprise dopants or clusters of atoms, the clusters of atoms comprising a highly cohesive carbide, nitride, oxide, or a composite ceramic material. The clusters of atoms are configured to have a grain boundary glass forming temperature of less than about 400° C. at the grain boundary (with bulk melting temperature greater than about 1400° C.). Doping the TI lamellae layers comprising BiSb having a (012) crystal orientation with clusters of atoms comprising a highly cohesive carbide, or nitride or oxide, or a composite ceramic material enable the SOT MTJ device to operate at higher temperatures while inhibiting migration of Sb from the BiSb of the TI lamellae layers.

In one embodiment, a spin-orbit torque (SOT) magnetic tunnel junction (MTJ) device comprises a topological insulator (TI) modulation layer, the TI modulation layer comprising: a plurality of bismuth or bismuth-rich bismuth antimony (BiSb) composition modulation layers comprising bismuth in an atomic percent of about 96% to about 100%, a plurality of TI lamellae layers, wherein the TI lamellae layers are co-deposited with clusters of atoms, the clusters of atoms comprising a carbide, a nitride, an oxide, or a composite ceramic material, and wherein the clusters of atoms are configured to have a grain boundary glass forming temperature of less than about 400° C. at a grain boundary with a bulk melting temperature less than about 1400° C., and a plurality of texturing layers.

In another embodiment, a SOT MTJ device comprises a TI modulation layer, the TI modulation layer comprising: a plurality of bismuth or bismuth-rich composition modulation layers comprising bismuth in an atomic percent of about 96% to about 100%, a plurality of TI lamellae layers comprising bismuth antimony (BiSb) having a crystal orientation of (012), wherein the TI lamellae layers are co-deposited with clusters of atoms, the clusters of atoms comprising a carbide, a nitride, an oxide, or a composite ceramic material, and a plurality of texturing layers, wherein each texturing layer is alternatingly layered between a TI lamellae layer.

In yet another embodiment, a SOT MTJ device comprises a buffer layer, an interlayer disposed over the buffer layer, and a TI modulation layer disposed between the buffer layer and the interlayer, the TI modulation layer comprising: a plurality of bismuth or bismuth-rich bismuth antimony (BiSb) composition modulation layers comprising bismuth in an atomic percent of about 96% to about 100%, a plurality of TI lamellae layers comprising BiSb having a crystal orientation of (012), wherein the TI lamellae layers are co-deposited with clusters of atoms, the clusters of atoms comprising a carbide, a nitride, an oxide, or a composite ceramic material, wherein each TI lamellae layer is disposed in contact with two bismuth or bismuth-rich BiSb composition modulation layers, and a plurality of texturing layers, wherein each texturing layer is disposed in contact with two bismuth-rich composition modulation layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 10 is a schematic cross-sectional view of a SOT MTJ used as a magnetoresistive random-access memory (MRAM) device.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
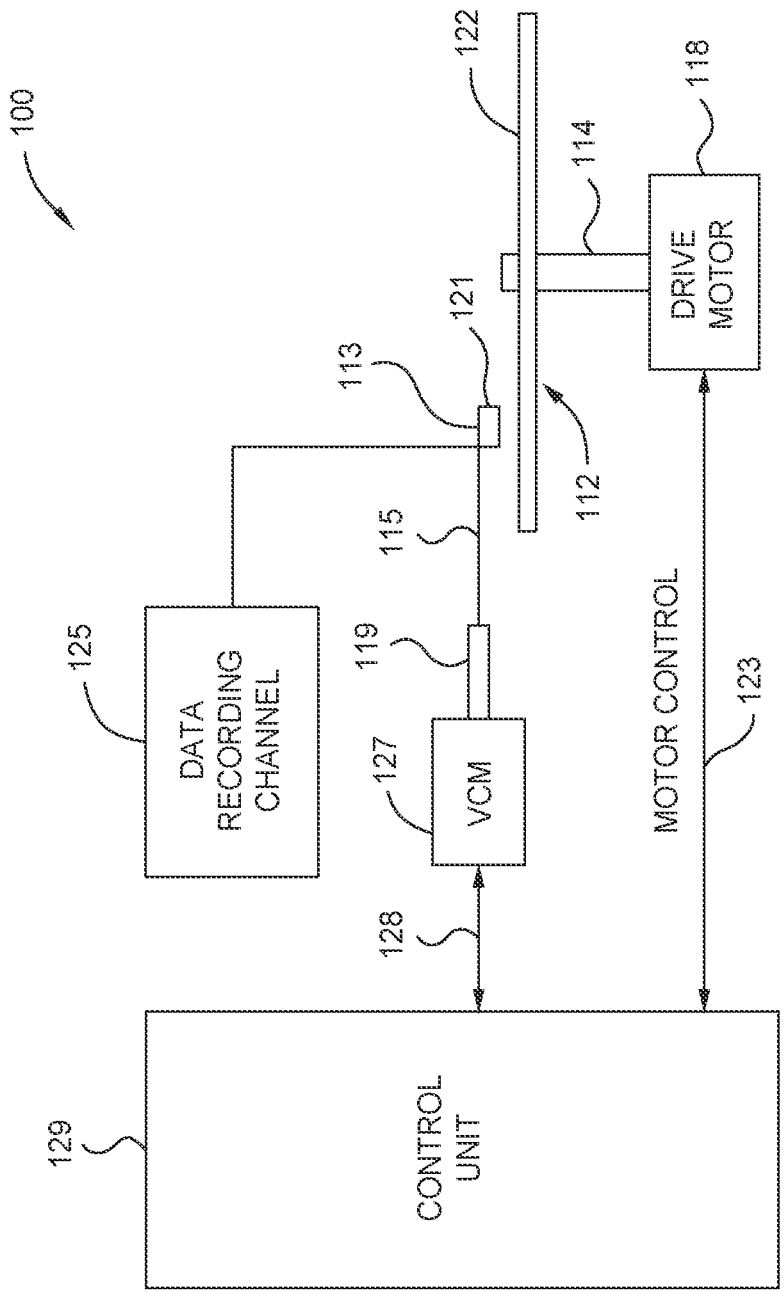
FIG. 1 is a schematic illustration of certain embodiments of a magnetic media drive including a MAMR write head having a SOT MTJ device.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relate to spin-orbit torque (SOT) magnetic tunnel junction (MTJ) devices comprising a topological insulator (TI) modulation layer. The TI modulation layer comprises a plurality of bismuth or bismuth-rich BiSb composition modulation layers, a plurality of TI lamellae layers comprising BiSb having a (012) crystal orientation, and a plurality of texturing layers. The TI lamellae layers comprise dopants or clusters of atoms, the clusters of atoms comprising a highly cohesive and a high chemical affinity to form carbide, a highly cohesive and a high chemical affinity to form nitride, a highly cohesive and a high chemical affinity to form oxide, or a composite ceramic material. The clusters of atoms are configured to have a grain boundary glass forming temperature of less than about 400° C. at the grain boundary (with bulk melting temperature greater than about 1400° C.). Doping the TI lamellae layers comprising BiSb having a (012) crystal orientation with clusters of atoms comprising a highly cohesive and a high chemical affinity to form carbide, a highly cohesive and a high chemical affinity to form nitride, a highly cohesive and a high chemical affinity to form oxide, or a composite ceramic material enable the SOT MTJ device to operate at higher temperatures while inhibiting migration of Sb or Bi from the BiSb of the TI lamellae layers.

Embodiments of the present disclosure generally relate to the introduction of atom clusters in a Topological Insulator (TI) layer having a (012) orientation. The introduction of the atom clusters during deposition may enhance the grain boundary volume and improve TI grain isolation such that the grain boundary (GB) may provide additional energy barriers against migration of the reactive TI components.

In the example that the TI is bismuth antimony (BiSb), the GB may prevent the antimony (Sb) from migrating. Antimony (Sb) is highly reactive, and the highly cohesive ceramic GB provides a low-reactive medium that reduces chemical interaction between the BiSb layer and external materials while promoting the growth of the BiSb in a (012) orientation.

A BiSb layer having a (012) orientation has a large spin Hall angle effect and high electrical conductivity. A BiSb layer having a (012) orientation can be used to form a spin-orbit torque (SOT) magnetic tunnel junction (MTJ) device. For example, a BiSb layer having a (012) orientation can be used as a spin Hall layer in a spin-orbit torque device in a magnetic recording head, e.g., as part of a read head, and/or a microwave assisted magnetic recording (MAMR) write head. In another example, a BiSb layer having a (012) orientation can be used as a spin Hall electrode layer in a magnetoresistive random access memory (MRAM) device. The SOT MTJ device can be in a perpendicular stack configuration or an in-plane stack configuration. The SOT MTJ device can be utilized in, for example, MAMR writing heads, in MRAM, in artificial intelligence chips, and in other applications. A topological insulator (TI) modulation layer composite 304 with a (012) orientation has a higher spin Hall angle and higher performance in a SOT MTJ device than a BiSb layer with a (001) orientation.

FIG. 1 is a schematic illustration of certain embodiments of a magnetic media drive 100 including a MAMR write head having a SOT MTJ device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
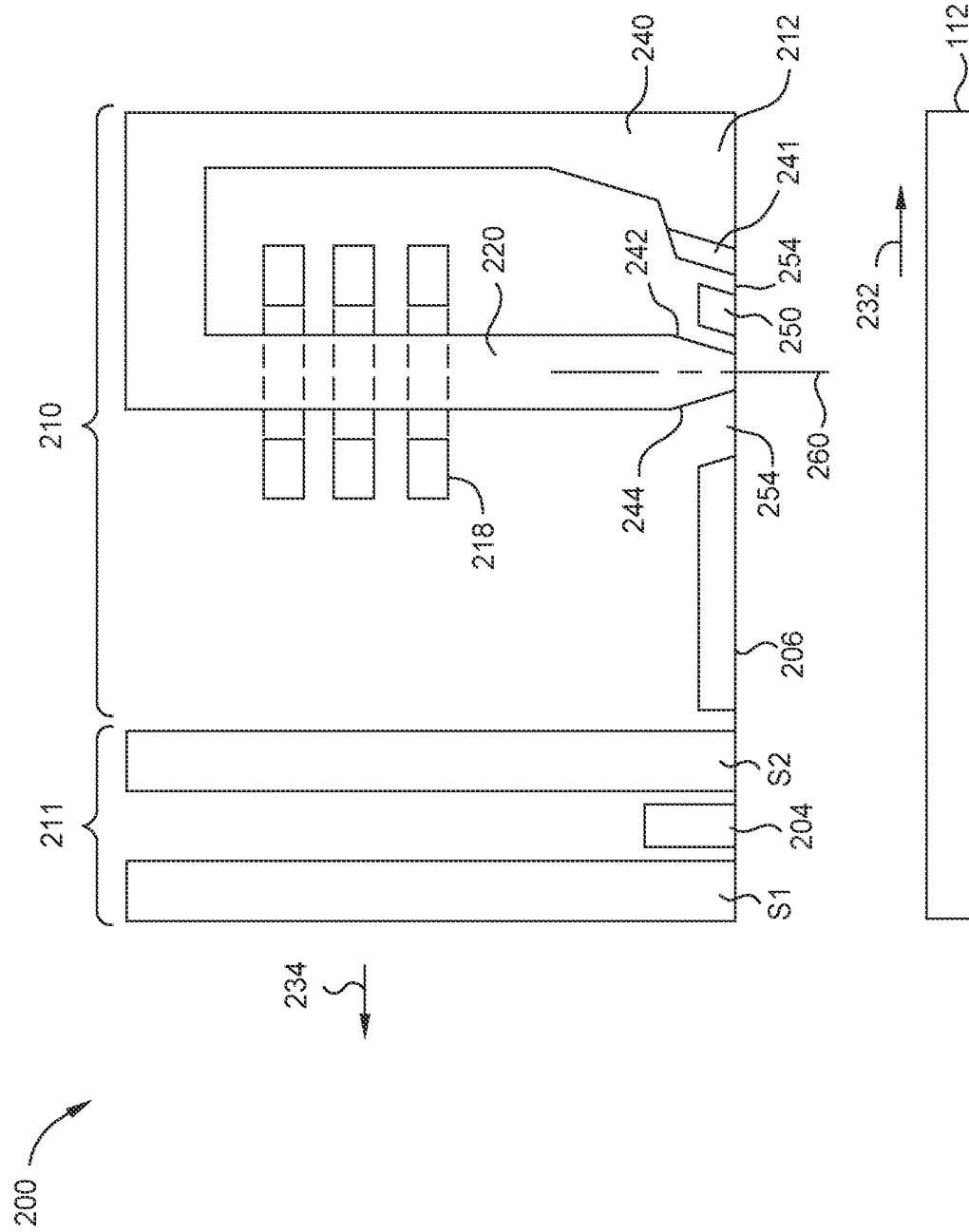
FIG. 2 is a fragmented, cross-sectional side view of certain embodiments of a read/write head having a SOT MTJ device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders.

FIG. 2 is a fragmented, cross-sectional side view of certain embodiments of a read/write head 200 having a SOT MTJ device. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a MAMR write head 210, and a magnetic read head 211. As shown in FIG. 2, the magnetic media 112 moves past the MAMR write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits. The SOT MTJ device of various embodiments can be incorporated into the read head 211.

The MAMR write head 210 includes a main pole 220, a leading shield 206, a trailing shield 240, a spin orbital torque (SOT) device 250, and a coil 218 that excites the main pole 220. The coil 218 may have a "pancake" structure which winds around a back-contact between the main pole 220 and the trailing shield 240, instead of a "helical" structure shown in FIG. 2. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220.

In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X includes at least one of Rh, Al, Ta, Zr, and Ti. In certain embodiments, the trailing shield 240 does not include a trailing shield hot seed layer.

Figure 3B:
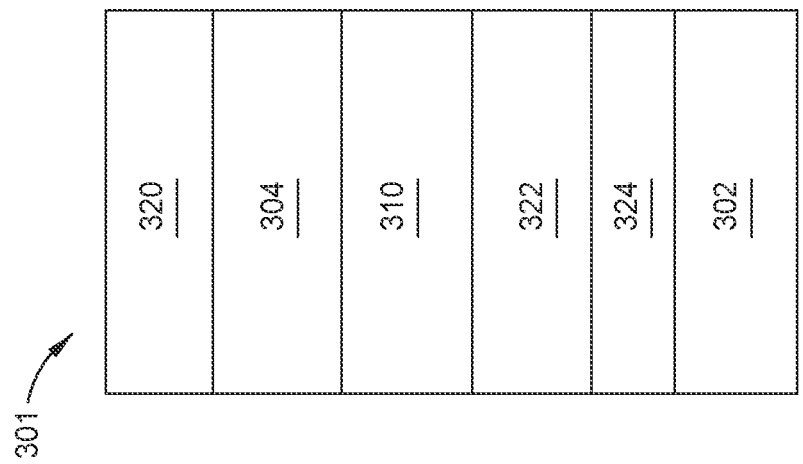
FIGS. 3A-3B illustrate spin-orbit torque (SOT) magnetic tunnel junction (MTJ) devices, according to various embodiments.
Figure 3A:
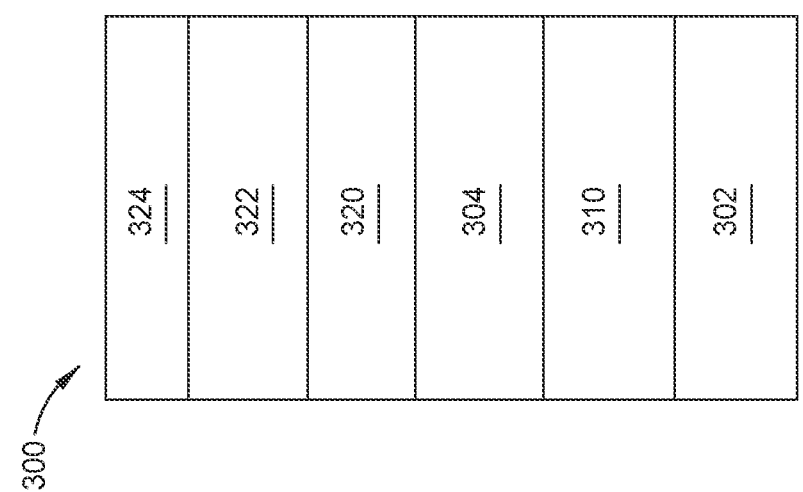

FIGS. 3A-3B illustrate spin-orbit torque (SOT) magnetic tunnel junction (MTJ) devices 300, 301, according to various embodiments. The SOT MTJ devices 300, 301 may each individually be used in the MAMR write head of the drive 100 of FIG. 1, the read/write head 200 of FIG. 2, or other suitable magnetic media drives.

FIG. 3A illustrates a SOT MTJ device 300, according to one embodiment. The SOT MTJ device 300 comprises a substrate 302, a buffer layer 310 disposed on the substrate 302, a TI modulation layer 304 comprising bismuth antimony (BiSb) with a crystal orientation of (012) disposed on the buffer layer 310, an interlayer 320 disposed on the TI modulation layer 304, a tunnel magnetoresistance (TMR)-like free layer 322 disposed on the interlayer 320, and a MgO layer 324 disposed on the TMR-like free layer 322.

FIG. 3B illustrates a reverse SOT MTJ device 301, according to one embodiment. The SOT MTJ device 301 comprises the substrate 302, a MgO layer 324 disposed on the substrate 302, a TMR-like free layer 322 disposed on the MgO layer 324, the buffer layer 310 disposed on the TMR-like free layer 322, the TI modulation layer 304 comprising BiSb with a crystal orientation of (012) disposed on the buffer layer 310, and the interlayer 320 disposed on the TI modulation layer 304. The SOT MTJ devices 300, 301 comprise the same layers 302, 304, 310, 320, 322, and 324 in different arrangements.

The substrate 302 can be a silicon substrate or an alumina substrate. The silicon substrate 302 has a cubic structure of (111), (100), (100), or other crystal orientations. The alumina substrate 302 has a hexagonal structure with (001) orientations or with other crystal orientations or has an amorphous structure. The substrate 302 can be a bare substrate or can have one or more layers formed thereover, such as an oxide layer thermally grown or deposited thereover.

In one embodiment, the interlayer 320 may be the same material as the buffer layer 310. For example, as shown in FIGS. 3A-3B, the interlayer 320 and the buffer layer 310 may each individually comprise a single layer of a crystalline or amorphous material. In another example, the interlayer 320 and the buffer layer 310 may each individually comprise multiple layers of crystalline and/or amorphous materials. In another embodiment, the interlayer 320 and the buffer layer 310 each individually comprises one or more different materials.

The buffer layer 310 and the interlayer 320 may each individually be a multilayer structure, as discussed further below in FIGS. 4A-4B. In one embodiment, the buffer layer 310 and/or the interlayer 320 is an amorphous metallic layer or a covalently bonded amorphous layer. The covalently bonded amorphous material may comprise one of a covalently bonded carbide, a covalently bonded oxide, or a covalently bonded nitride, or a composite ceramic. The covalently bonded amorphous material or metal amorphous layer should have a nearest neighbor XRD diffraction peak of about 2.0 Å to 2.2 Å which would correspond to a (111) d-spacing of cubic fcc lattice with a lattice constant ($a_{fcc}$) between about 3.5 Å and 3.8 Å, and the metallic or covalently bonded amorphous material has a nearest neighbor distance equal to about $a_{fcc}$ divided by the square root of 2. The covalently bonded amorphous material should have a low band gap, exhibit metallic bonding, or be somewhat conductive.

In some embodiments, the buffer layer 310 and the interlayer 320 each individually comprises one or more highly cohesive bonded materials such that the materials are less likely to interact with the TI modulation layer 304 than ionic chemicals. As further discussed below in FIGS. 4A-4B, the buffer layer 310 and the interlayer 320 may each individually comprise one or more materials selected from the group consisting of: a highly cohesive covalently bonded amorphous material, a tetragonal (001) material, a tetragonal (110) material, a body-centered cubic (bcc) or ordered B2 cubic (100) material, a face-centered cubic (fcc) (100) material, a textured bcc (100) material, a textured fcc (100) material, a textured (100) material, an amorphous metallic material, a fcc (111) textured material, a hexagonal close-packed (hcp) (002) textured material, and a layered combination of one or more of any of the preceding materials. Each of the fcc (100), bcc (100), tetragonal (001), and tetragonal (110) materials should either have low band gaps, exhibit metallic bonding, or be somewhat conductive.

The amorphous metallic material may be selected from the group consisting of: NiTa, NiFeTa, NiNb, NiW, NiFeW, NiFeHf, CoHfB, CoZrTa, CoFeB, NiFeB, CoB, FeB, and alloy combinations thereof with one or more elements selected from the group consisting of: Ni, Fe, Co, Zr, W, Ta, Hf, Ag, Pt, Pd, Si, Ge, Mn, Al, and Ti.

The textured (100) layer may be selected from the group consisting of: (1) RuAl, and (2) Cr incorporated according to several options: (2a) deposited at a temperature greater than or equal to 250° C., (2b) in heated CrX alloys where X=Ru, Mo, W, Ti<10 atomic percent (at. %), (2c) CrMon wherein n is about 20 at. % to about 50 at. %, or (2d) in a stack of heated Cr/CrMon or CrMon/Cr/CrMon laminate (e.g., heated to less than or equal to about 200° C.), and (2e) in combinations with other B2 phase materials such as NiAl and RhAl.

The tetragonal (001) or (110) material may have an a-axis in the range of about 4.4 Å to about 4.75 Å and a c-axis in the range of about 2.86 Å to about 3.19 Å. The tetragonal (001) or (110) material may have an a-axis lattice parameter in the range of about 4.20 Å to about 4.75 Å. The tetragonal (001) or (110) material may be selected from the group consisting of: $SbO_2$, $TiO_2$, $IrO_2$, $RuO_2$, $CrO_2$, $VO_2$, $OsO_2$, $RhO_2$, $PdO_2$, $WVO_4$, $CrNb_{O4}$, $SnO_2$, $GeO_2$, ZnNb, and ZnTa, composites thereof, and alloys thereof with one or more elements selected from the group consisting of: W, Ta, and Nb.

The fcc (100) material may have a lattice parameter in the range of about 4.08 Å to about 4.75 Å. The fcc (100) material may selected from: (1) a rock salt type cubic; (2) an fcc (100) material selected from the group consisting of: FeO, CoO, NiO, ZrO, MgO, TiO, ScN, TiN, NbN, ZrN, HfN, TaN, ScC, TiC, NbC, ZrC, HfC, TaC, and WC; (3) a zinc blende cubic fcc (100) materials selected from the group consisting of: CoO, SiC, GaN, FeN, and ZnO; and (4) composite combinations of (1), (2), and/or (3) thereof with one or more elements selected from the group consisting of: W, Al, and Si. In other words, the fcc (100) material is selected from the group consisting of: FeO, CoO, NiO, ZrO, MgO, TiO, ScN, TiN, NbN, ZrN, HfN, TaN, ScC, TiC, NbC, ZrC, HfC, TaC, WC, CoO, SiC, GaN, FeN, ZnO, and composite combinations thereof with one or more elements selected from the group consisting of: W, Al, and Si.

The bcc (100) material may selected from the group consisting of: V, Nb, Mo, W, Ta, $WTi_{50}$, $Al_{10}Nb_{40}Ti_{50}$, Cr, CrMo, RuAl in a B2 phase, NiAl in a B2 phase, and alloy combinations thereof with one or more elements selected from the group consisting of: Ti, Al, Pd, Pt, Ni, Fe, and Cr.

The covalently bonded amorphous material may comprise one of a covalently bonded carbide, a covalently bonded oxide, a covalently bonded nitride, or a ceramic composite thereof. The covalently bonded amorphous material should have a nearest neighbor XRD diffraction peak with d-spacing from about 2.0 Å to about 2.2 Å, which could correspond to the (111) d-spacing from $a_{fcc}$ crystal structure with $a_{fcc}$ between about 3.5 Å and 3.8 Å. The highly cohesive covalently bonded amorphous materials should either have low band gaps or exhibit metallic bonding or be somewhat conductive.

The fcc (111) textured material can be selected from any material with an a-axis in the range of 3.49 Å<$a_{fcc}$<3.71 Å, or hcp (002) textured material from any material with a-axis in the range of 2.47 Å<ahcp<2.63 Å.

Figure 4A:
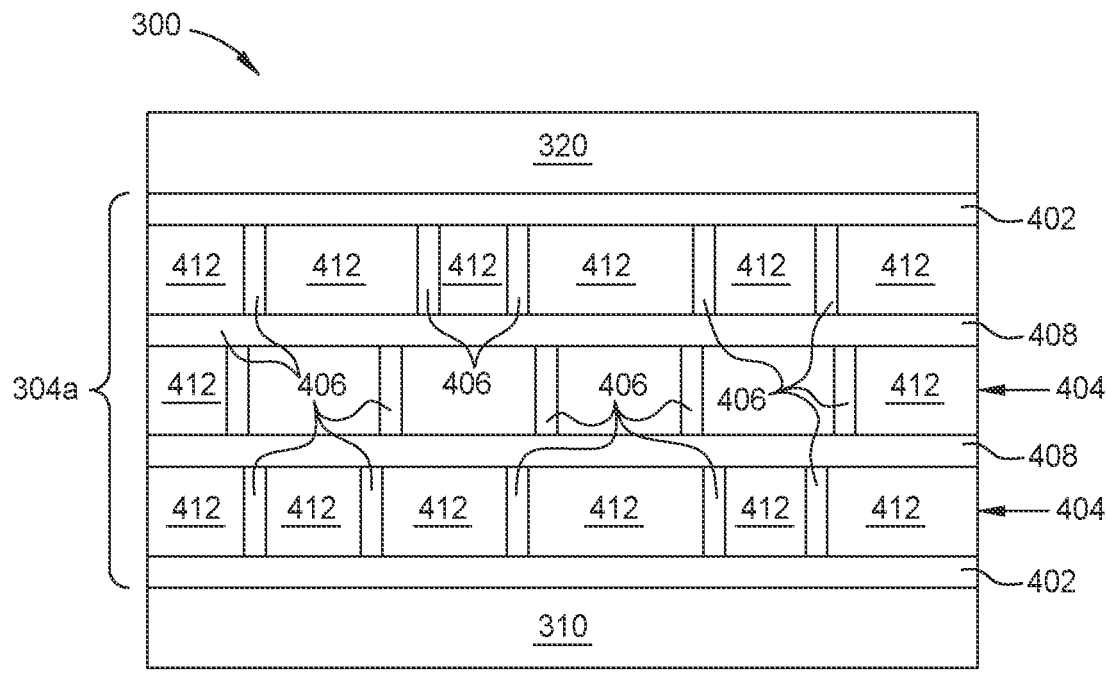
FIGS. 4A-4B illustrate exemplary multilayer structures of a TI modulation layer that may be utilized with the SOT MTJ devices of FIGS. 3A-3B, according to various embodiments.
Figure 4B:
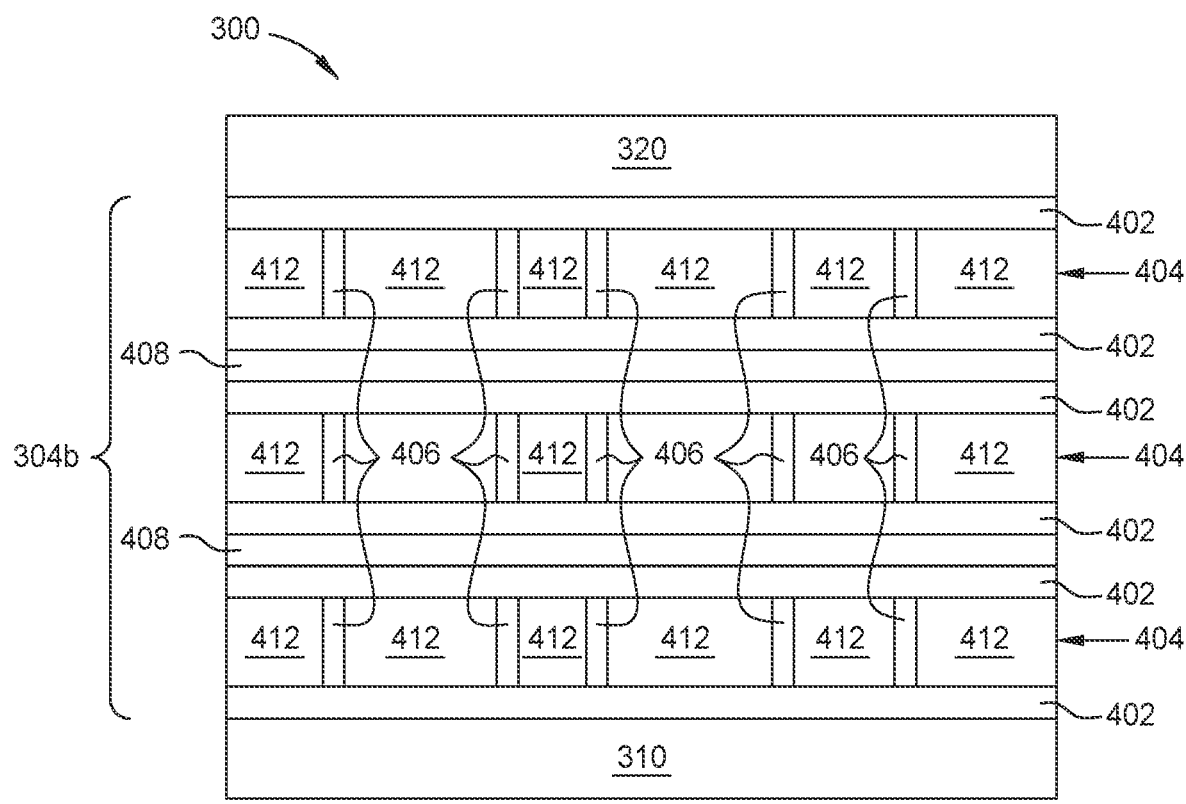

FIGS. 4A-4B illustrate exemplary multilayer structures of the TI modulation layer 304 that may be utilized with the SOT MTJ devices 300, 301 of FIGS. 3A-3B, according to various embodiments. FIGS. 4A-4B illustrate the TI modulation layer 304 being utilized in the SOT MTJ device 300 of FIG. 3A, however the TI modulation layer 304a, 304b of FIGS. 4A-4B can be utilized in the SOT MTJ device 301 of FIG. 3B as well. Both the TI modulation layer 304a and the TI modulation layer 304b may be the TI modulation layer 304 of FIGS. 3A and/or 3B. As shown in FIGS. 4A-4B, the TI modulation layer 304a, 304b may comprise of one or more Bi or Bi rich BiSb composition modulation layers 402, one or more texturing layers 408, and one or more TI lamellae layers 404 co-deposited with clusters of atoms 406 comprising a carbide, a nitride, an oxide, or a composite ceramic material, which either has a low band gap, or exhibits metallic bonding, or is somewhat conductive. The one or more Bi or Bi rich BiSb composition modulation layers 402 comprise Bi in an atomic percent between about 96% to about 100%.

As discussed further below, the TI lamellae layers 404 comprise BiSb having a (012) crystal orientation 412 and a dopant or clusters of atoms 406 comprising a carbide, a nitride, an oxide, or a composite ceramic material. The TI lamellae layers 404 may be laminated structures comprising BiSb lamellae 412 and dopant lamellae 406, as discussed further below in FIGS. 5A-5C.

Exemplified in FIG. 4A, the TI lamellae layers 404 may be alternatingly layered with texturing layers 408 and disposed between Bi or Bi-rich BiSb composition modulation layers 402. Thus, in one embodiment shown in FIG. 4A, the TI modulation layer 304a comprises a first Bi-rich composition layer 402 is disposed on the buffer layer 310, a first TI lamellae layer 404 is disposed on the first Bi rich composition layer 402, a first texturing layer 408 is disposed on the first TI lamellae layer 404, a second TI lamellae layer 404 is disposed on the first texturing layer 408, a second texturing layer 408 is disposed on the second TI lamellae layer 404, a third TI lamellae layer 404 is disposed on the second texturing layer 408, and a second Bi or Bi-rich BiSb composition layer 402 is disposed on the third TI lamellae layer 404. While three TI lamellae layers 404, two texturing layers 408, and two Bi-rich composition layers 402 are shown in FIG. 4A, the TI modulation layer 304a may comprise fewer or additional TI lamellae layers 404, texturing layers 408, and Bi or Bi-rich BiSb composition layers 402.

FIG. 4B displays another exemplary configuration of the TI modulation layer 304b, according to another embodiment. In FIG. 4B, the TI lamellae layers 404 are sandwiched between Bi or Bi-rich BiSb composition layers 402 (i.e., comprising Bi in an atomic percent of about 96% to about 100%), which are then alternatingly layered with texturing layers 408. In other words, the TI modulation layer 304 of FIG. 4B is similar to the TI modulation layer 304a of FIG. 4A; however, each of the texturing layer 408 is disposed between and in contact with two Bi-rich composition layers 402. FIGS. 4A-4B are examples of possible TI modulation layer 304 structures, but the disposition of the layers 402, 404, 408 within the TI modulation layer 304 are not limited to the examples in FIGS. 4A-4B.

The texturing layers 408 may be selected from the group consisting of: an amorphous material comprising a highly cohesive and a high chemical affinity to form covalently bonded carbide, a highly cohesive and a high chemical affinity to form covalently bonded oxide, a highly cohesive and a high chemical affinity to form covalently bonded nitride, a face centered cubic (fcc) (100) textured material, a tetragonal (001) textured material, a tetragonal (110) textured material, a body centered cubic (bcc) (100) textured material, a fcc (111) textured material, and a hcp (002)

textured metal. The texturing layers 408 that comprise an amorphous material comprising a highly cohesive and a high chemical affinity to form covalently bonded carbide, a highly cohesive and a high chemical affinity to form covalently bonded oxide, or a highly cohesive and a high chemical affinity to form covalently bonded nitride form a strong ionic or covalent chemical bond with the BiSbX alloy so that the carbide, nitride, and/or oxide is more energetically favorable to stay bonded then to disassociate and react with the BiSbX alloy.

The amorphous material used in the texturing layers 408 may comprise covalently bonded carbide, covalently bonded oxide, covalently bonded nitride, or an amorphous metallic layer and has a nearest neighbor XRD diffraction peak with d-spacing from about 2.0 Å to about 2.2 Å, which could correspond to the (111) d-spacing from $a_{fcc}$ crystal structure with $a_{fcc}$ between about 3.5 Å and 3.8 Å. The highly cohesive with the high chemical affinity (to carbon, oxygen, or nitrogen) to form covalently bonded amorphous materials should either have low band gaps or exhibit metallic bonding or be somewhat conductive.

The fcc (100) textured material used in the texturing layers 408 may be selected from the group consisting of: (1) FeO, CoO, NiO, ZrO, MgO, TiO, ScN, TiN, NbN, ZrN, HfN, TaN, ScC, TiC, NbC, ZrC, HfC, TaC, and WC; the zinc blende cubic fcc (100) materials selected from the group consisting of: CoO, SiC, GaN, FeN, and ZnO; and (3) composite combinations of (1) and (2) thereof with one or more elements selected from the group consisting of: W, Al, and Si. In other words, the fcc (100) textured material is selected from the group consisting of: FeO, CoO, NiO, ZrO, MgO, TiO, ScN, TiN, NbN, ZrN, HfN, TaN, ScC, TiC, NbC, ZrC, HfC, TaC, WC, CoO, SiC, GaN, FeN, ZnO, and composite combinations thereof with one or more elements selected from the group consisting of: W, Al, and Si.

The fcc (111) textured material can be selected from any material with an a-axis in the range of 3.49 Å<$a_{fcc}$<3.71 Å, or hcp (002) textured material from any material with a-axis in the range of 2.47 Å<$a_{hcp}$<2.63 Å.

The tetragonal (001) and (110) textured material used for the texturing layers 408 may be selected from the group consisting of: $SbO_2$, $TiO_2$, $IrO_2$, $RuO_2$, $CrO_2$, $VO_2$, $OosO_2$, $RhO_2$, $RhO_2$, $PdO_2$, $WVO_4$, $CrVO_4$, $CrNbO_4$, $SnO_2$, $GeO_2$, in combinations thereof with elements of Zn, Ti, Nb, and Ta, and in composite combinations thereof. In some embodiments, the dopant or clusters of atoms 406 within the TI lamellae layers 404 comprise a tetragonal material or any highly cohesive with a high chemical affinity to carbon, oxygen, or nitrogen to form ceramic material with low band gap, a strong or covalent chemical bond with BiSb, a material that exhibits metallic bonding, or a material that is somewhat conductive, with a melting temperature greater than about 1400° C.

The TI lamellae layers 404 comprise BiSb having a (012) orientation 412 co-sputtered with dopants or clusters of atoms 406 comprising a carbide, a nitride, an oxide, or a composite ceramic material. When the dopant or clusters of atoms 406 comprise a composite ceramic material, the composite ceramic material may be selected from the group consisting of: Bi, Pb, Ga, Sc, Si, Ti, V, Cr, Mn, Fe, Zr, Nb, Mo, In, Ir, Ru, V, Os, Rh, Pd, WV, CrV, CrNb, Ge, Zn, ZnNbTi, ZnTiTa, Co, Mg, Sn, Sb, Te, Hf, Ta, W, oxides thereof, nitrides thereof, carbides thereof, and composite ceramic combinations thereof.

The dopant or clusters of atoms 406 may be low melting point ceramics like oxides of Bi, Sn, Sb, Pd, In, for example, as such bulk ceramics have low melting points and form cohesive covalently bonded structures with high oxygen affinity with either low band gaps, or exhibit metallic bonding character, or are somewhat conductive with high resistivities. These clusters will generally prefer to stay as a cluster and not disassociate and react with the BiSbX metal, and easily coalesce and form oxide glasses at the grain boundary. The low melting ceramic atom clusters mentioned above are wetted by low melting point TI metals like BiSbX alloys and its alloys, and will coalesce and form ceramic glasses at the grain boundary that should increase the processing temperature of the BiSbX alloy, as well as improve Sb and/or Bi thermal migration. The ceramic clusters will form cohesive, high chemical affinity to carbon, oxygen, or nitrogen to form strong ionic or covalently bonded structures that will not tend to combine with the BiSbX alloy and will serve as a thermal migration grain boundary barrier. Lower melting point grain boundary ceramic glasses may offer some engineering benefits if high temperatures are needed in the manufacturing process, or offer better material property compromises, or ease in the building of the SOT devices.

The dopant or clusters of atoms 406 may have a melting temperature less than about 1400° C. Due to the small size of the clusters of atoms and the alloy interactions, the melting point of the clusters of atoms may be substantially reduced. The clusters of atoms may be configured to have a grain boundary glass forming temperature of less than about 400° C. Doping the TI lamellae layers 404 with the clusters of atoms 406 reduce BiSbX grain growth in the TI lamellae layers 404 and provide epitaxial growth with BiSb (012) textured layer. Because of the highly cohesive, high chemical affinity to carbon, oxygen, or nitrogen, the ionic or covalent chemically bonded nature of the dopant or clusters of atoms 406, the dopant or clusters of atoms 406 will tend to stay as a cluster and have minimal chemical interaction with the BiSbX alloy of the TI lamellae layers 404, thereby provide an interfacial layer barrier against Sb migration while reducing grain growth in the MTJ SOT devices 300, 301 and improving roughness.

Each of the TI lamellae layers 404 may be treated with low energy and glancing angle plasma treatments (PT) to improve the growth roughness and overall stack roughness of the SOT MTJ device. The clusters of atoms 406 may be low melting point alloys with high thermal mobility and at least some of the clusters of atoms are oxidized during the co-sputtering. The method of forming the SOT MTJ device 300, 301 may comprise post annealing. The annealing process melts the clusters of atoms to form a glass boundary around the TI grains.

Figure 5A:
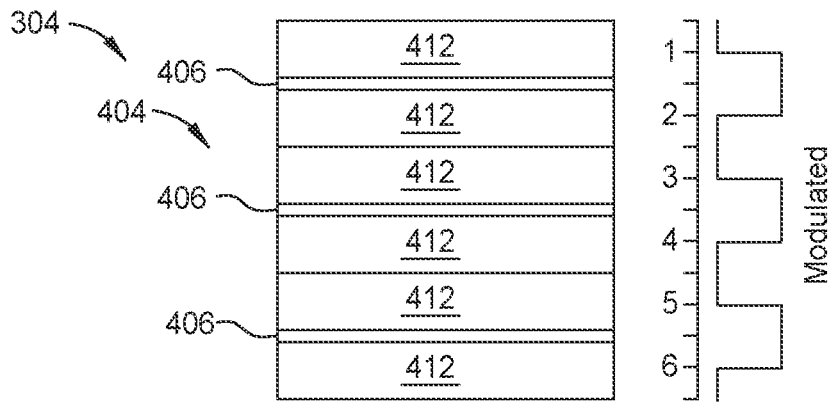
FIGS. 5A-5C illustrate exemplary laminated structures of a TI lamellae layers of TI modulation and texturing layers as a function of depth.
Figure 5B:
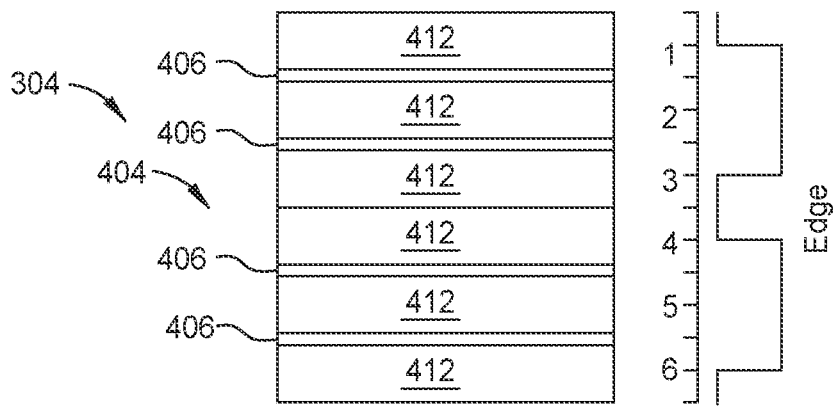
Figure 5C:
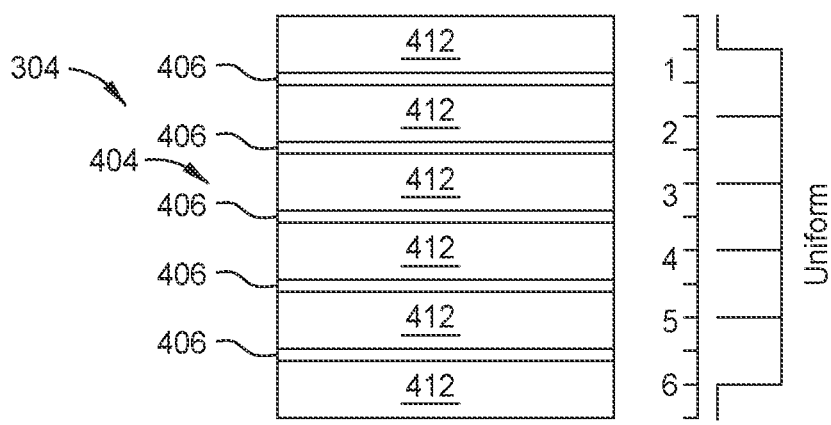

FIGS. 5A-5C illustrate exemplary laminated structures of a TI lamellae layers 404 of TI modulation and texturing layers 304 as a function of depth. In FIGS. 5A-5C, the dopants or clusters of atoms 406 (i.e., dopant X lamellae) comprise a carbide, a nitride, an oxide, or a composite ceramic material as discussed above, and the BiSb lamellae 412 comprises BiSbX having a crystal orientation of (012). FIG. 5A shows a modulated structure, where each cluster of atoms 406 is doped between two BiSb lamellae 412. FIG. 5B shows an edge structure, wherein for every two clusters of atoms 406, there are three BiSb lamellae 412. FIG. 5C shows a uniform structure wherein the BiSb lamellae 412 and the clusters of atoms 406 are evenly distributed. FIGS. 5A-5C are examples of the doping of the clusters of atoms 406 within the BiSb lamellae 412, and the TI modulation layer 304 can contain any method of non-uniform distribution of doping clusters of atoms 406 into the BiSb lamellae 412.

Figure 6B:
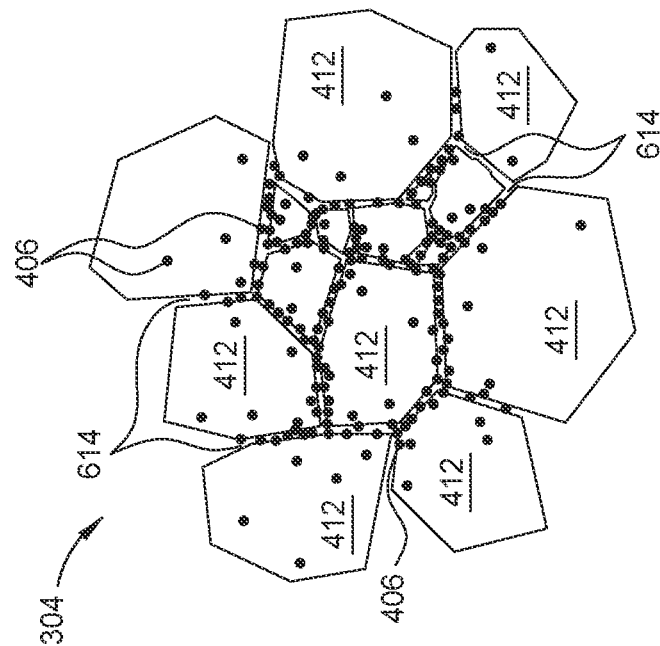
FIGS. 6A-6B illustrate the ability to modify the grain structure before and after melting of a TI lamination layer.
Figure 6A:
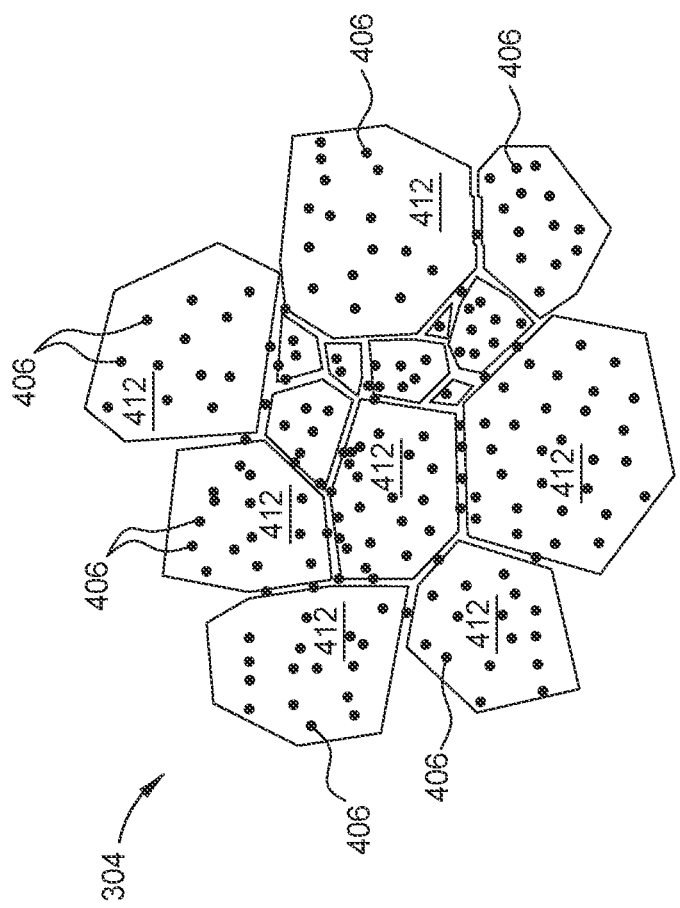

FIGS. 6A-6B illustrate the ability to modify the grain structure before and after melting of the TI lamination layer 304. The TI modulation layer 304 may melt during use of the MTJ SOT device 300, 301, for example. FIG. 6A shows a BiSb lamellae 412 deposition followed by a thin uniform deposition of clusters of atoms 406. As shown in FIG. 6A, the clusters of atoms 406 are randomly disposed on the BiSb lamellae 412. FIG. 6B shows the distribution of the clusters of atoms 406 after the BiSb lamellae 412 growth and anneal. As shown in FIG. 6B, the clusters of atoms 406 migrate to the grain boundaries 614 of the BiSb lamellae 412, resulting in the grain boundary 614 strengthening against thermal movement while providing an additional barrier against Sb migration. The dopants or clusters of atoms 406 reduce the as-deposited grain size of the BiSbX lamellae 412, allowing for thermal migration to the grain boundary 614 through grain coarsening on post annealing.

Figure 7:
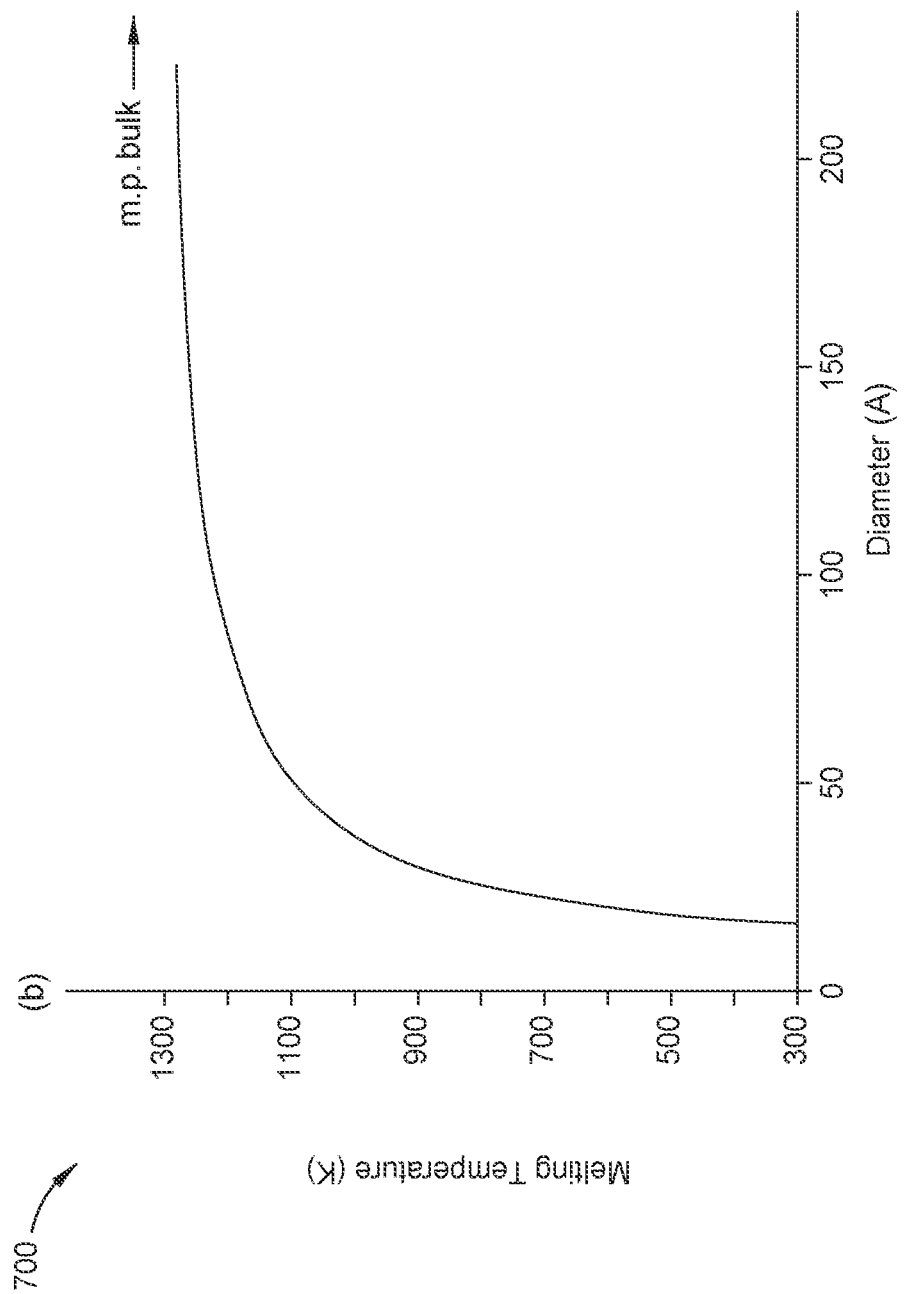
FIG. 7 is a graph illustrating melting temperature in K versus the diameter of the nanocrystals of Au particles, taken from the reference P. Buffat, and J-P. Borel, Phys Rev. A, Vol. 13, Num. 6, 1976, indicating that the melting point of nanocrystals of Au melt well below the bulk melting temperature (Tm).

FIG. 7 is a graph 700 illustrating melting temperature of nano-particles of Au in K versus the diameter of the Au nano-particles. This behavior is generally true of all materials when the feature size, particle size, or cluster size is reduced, the melting of the material used to form those features is also reduced. In the case of Au, the melting temperature is 1000° C. for 10 Å particle sizes or 600° C. for 20 Å particle sizes. Literature shows this is also true of thin surface or interfacial layers, and grain boundaries where the pre-melting and complete wetting of grain boundaries can be achieved well below the bulk melting temperature of the material. The dopants or clusters of atoms 406 can reduce as-deposited BiSbX lamellae 412 grain size. However, upon melting, the TI modulation layer 304 reverts to large grain size at room temperature, and with proper buffer 310, texturing 408, and interlayers 320, the TI modulation layer 304 retains its crystalline structure and most of its (012) texture after melting.

Figure 8A:
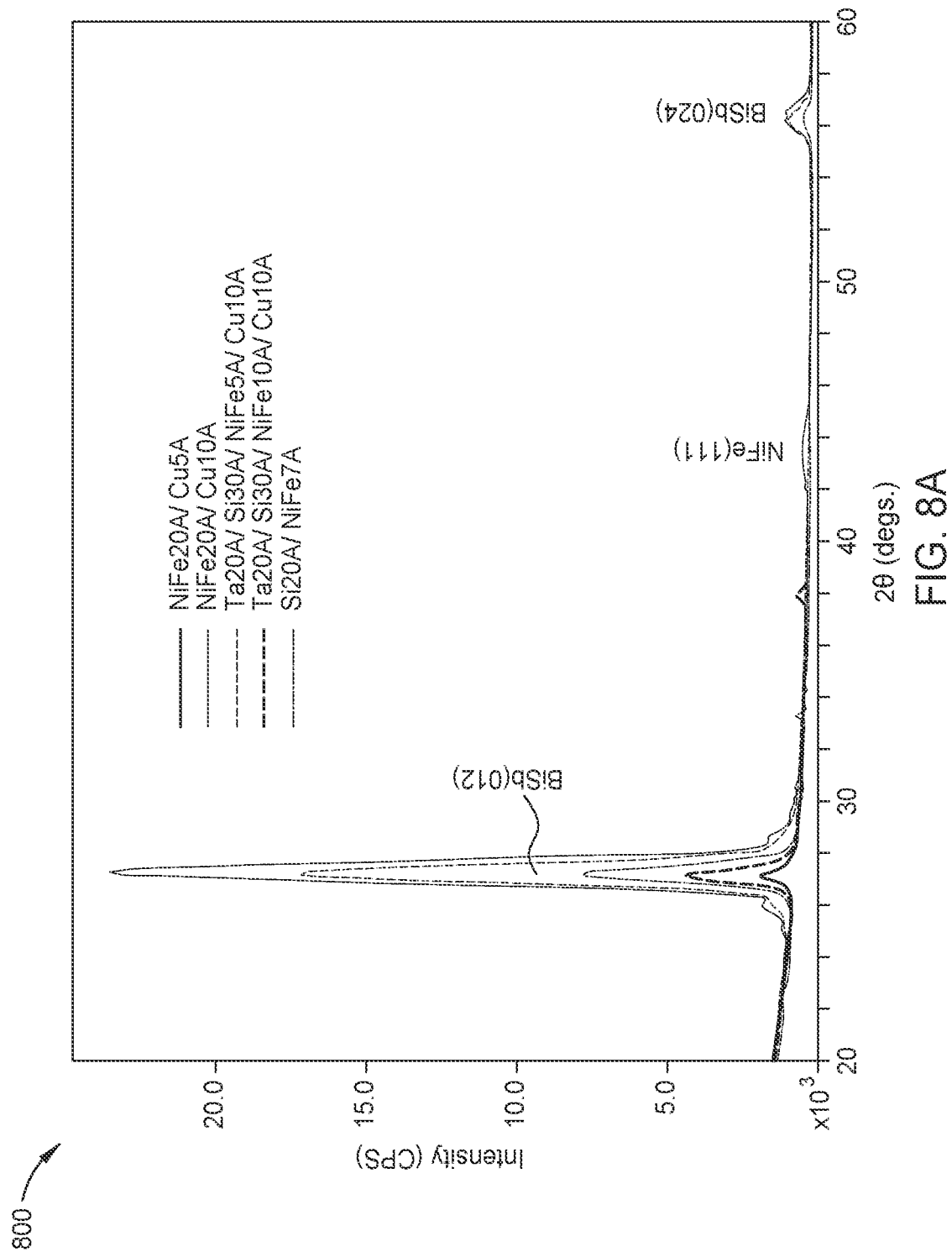
FIG. 8A is a graph illustrating utilizing 3-fold fcc (111) texturing layers to improve BiSb(012) epitaxy and interfacial roughness.

FIG. 8A is a graph 800 illustrate utilizing (111) textured texturing layers to improve epitaxy during growth improves the interfacial roughness. The highest texture of about 8 degrees full width at half maximum (FWHM) has the lowest interface roughness of less than about 8 Å. Layers 310, 320, and 408 could be a 3-fold fcc (111) textured material with lattice spacing in the range of 3.49 Å<$a_{fcc}$<3.71 Å, or a hcp (002) textured material with a-axis in the range of 2.47 Å<$a_{hcp}$<2.63 Å.

Figure 8B:
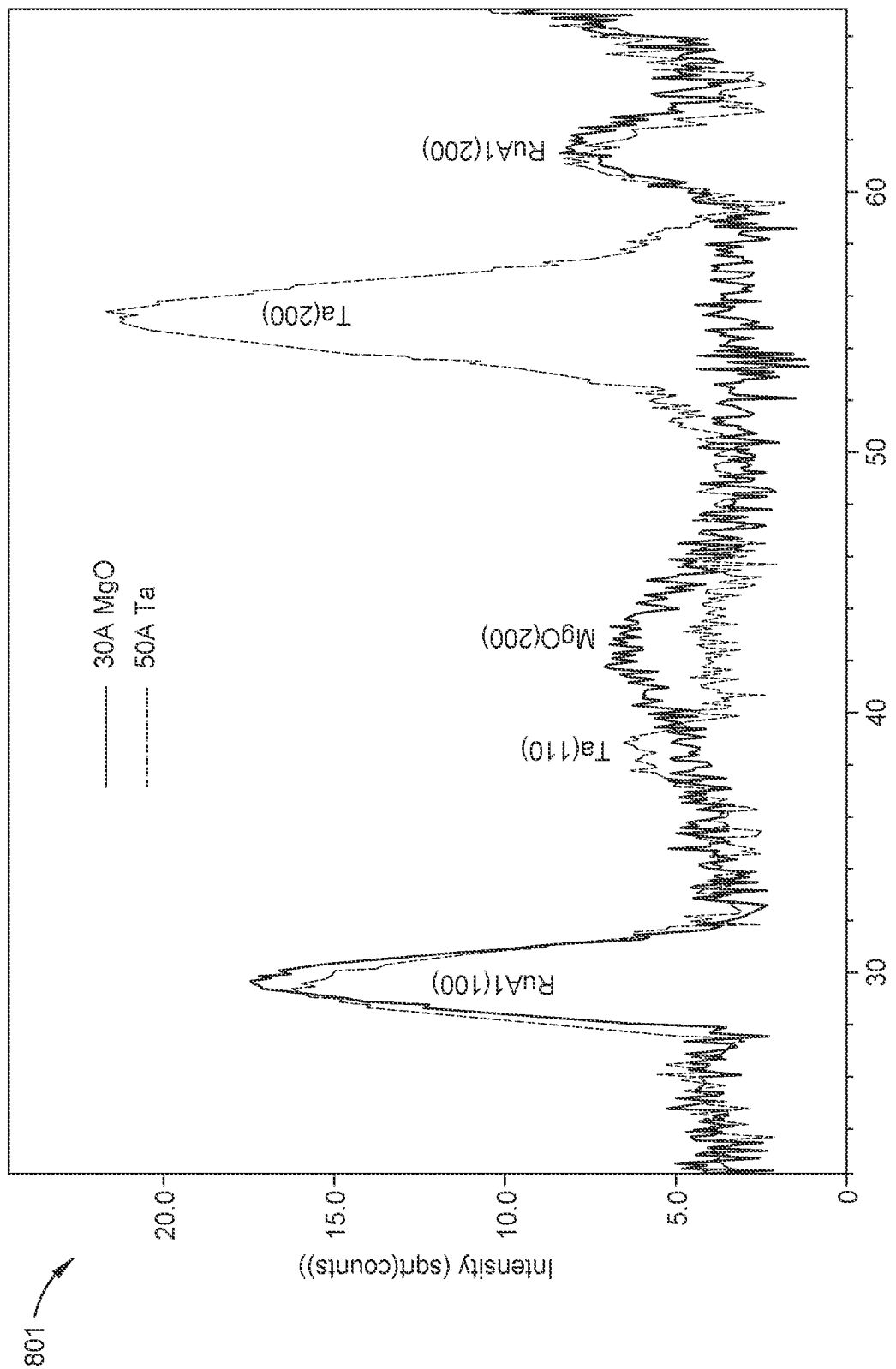
FIGS. 8B-8C are graphs illustrating utilizing various 4-fold texturing layers of bcc (100) Cr, Ta, W, B2 (100) NiAl, and fcc(100) MgO, which could be used to produce a BiSb (012) texture in a BiSb layer.
Figure 8C:
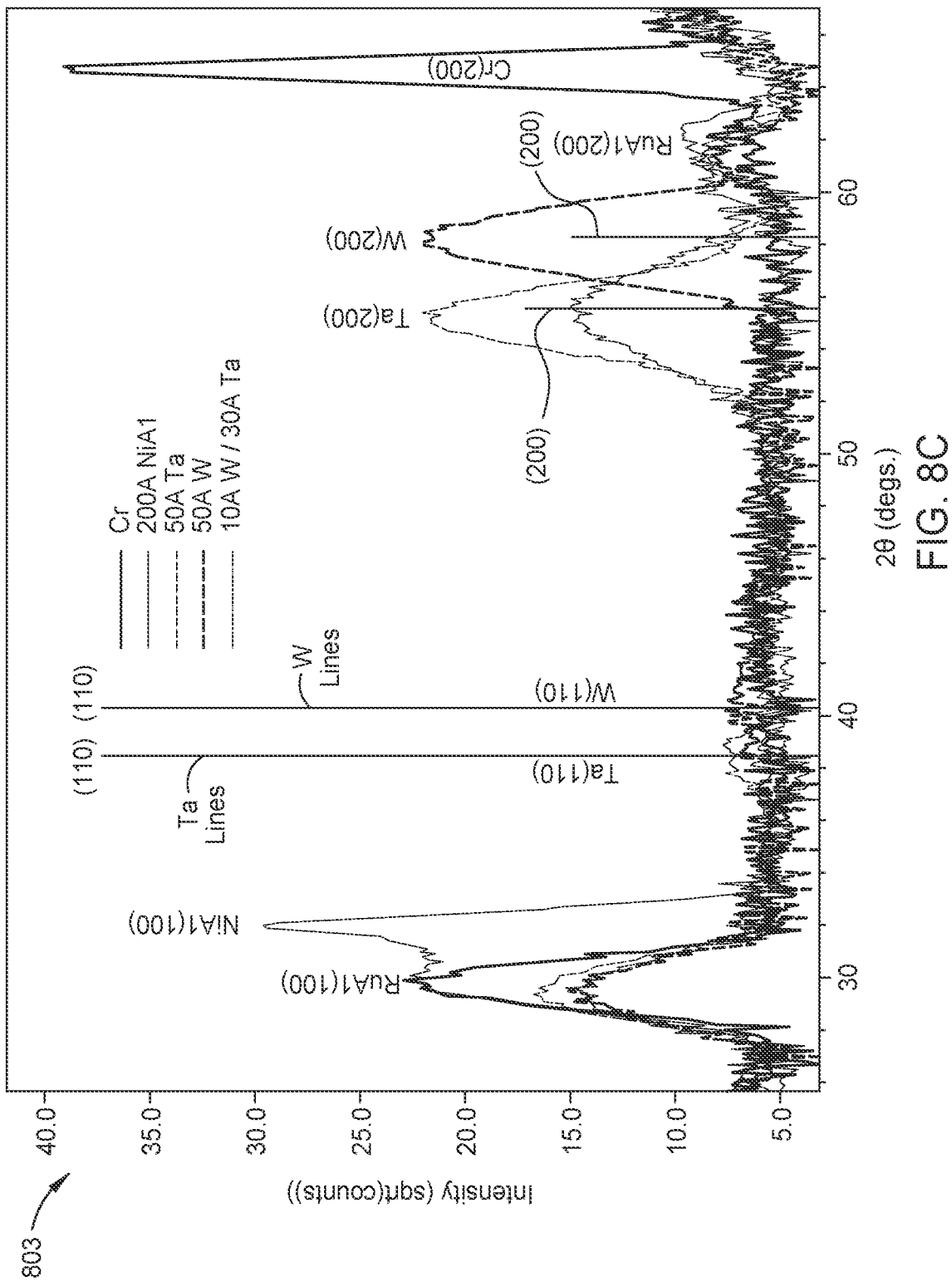
Figure 8D:
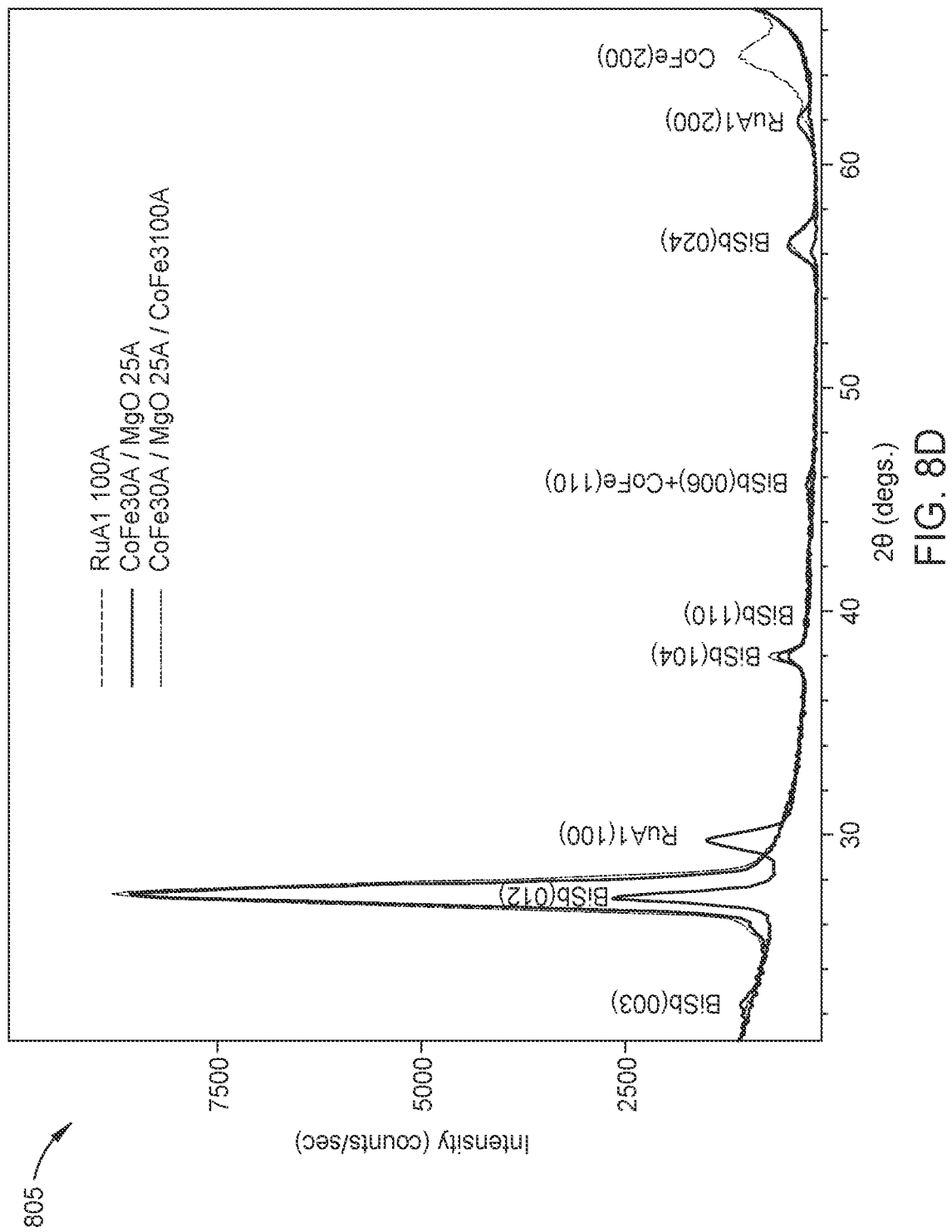
FIG. 8D is a graph showing using 4-fold (100) texturing layers to produce a highly textured (012) BiSb layer.
Figure 8E:
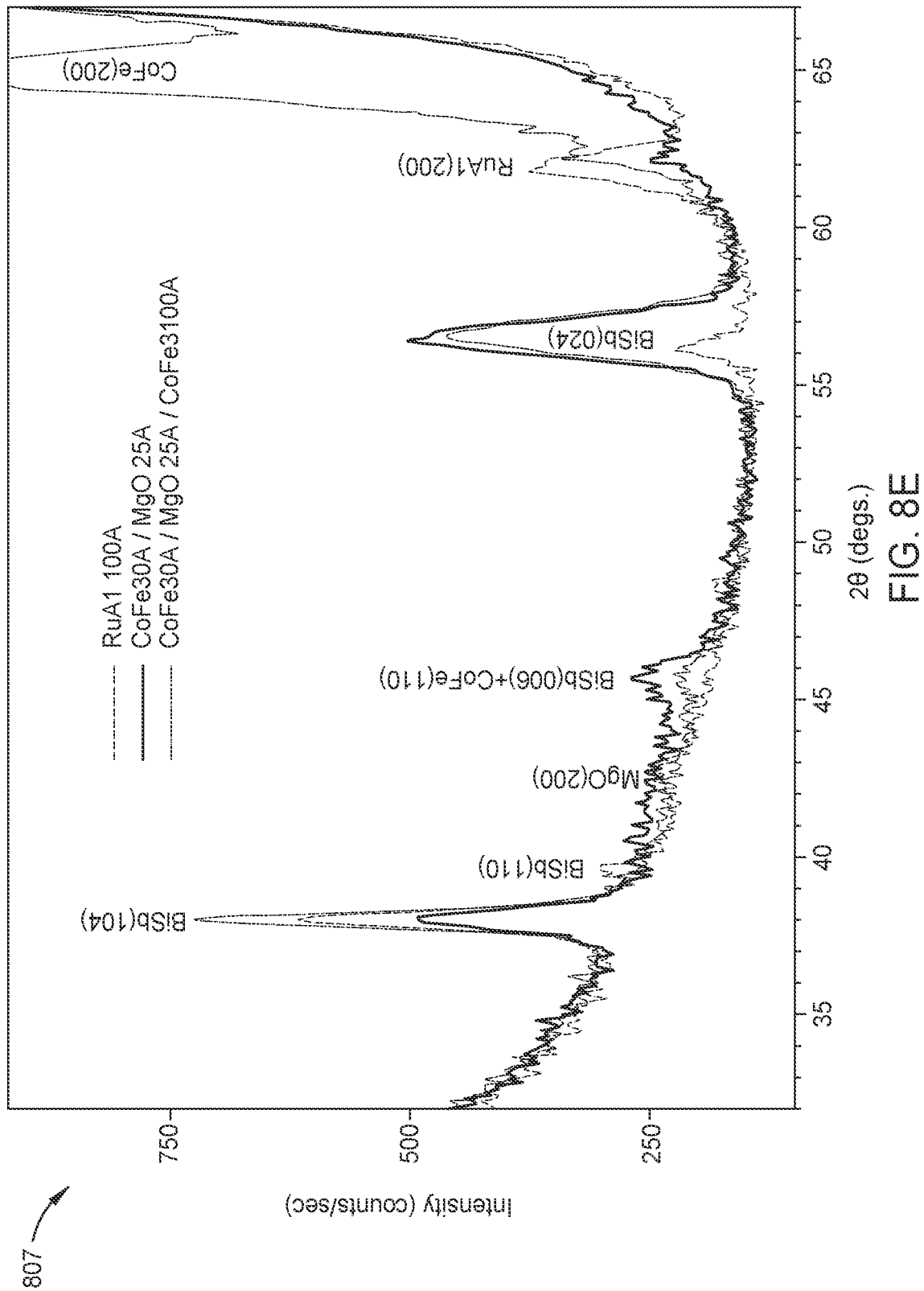
FIG. 8E is a blow up of the graph of FIG. 8D showing a MgO (100) film having (100) texture, where the grain size of the MgO film is small so the peak appears broad around 42 degrees in the out-of-plane 2-theta XRD plot.

FIG. 8B and FIG. 8C are graphs 801, 803, respectively, showing examples of 4-fold texturing layers which could be used to produce a BiSb(012) texture. FIG. 8D is a graph 805 showing examples of 4-fold texturing layers which produce a highly textured BiSb(012) film. FIG. 8E is a graph 807 showing a blown up portion of the graph 805 of FIG. 8D, illustrating that a 25 Å thick MgO texturing film has a (100) texture.

Figure 9A:
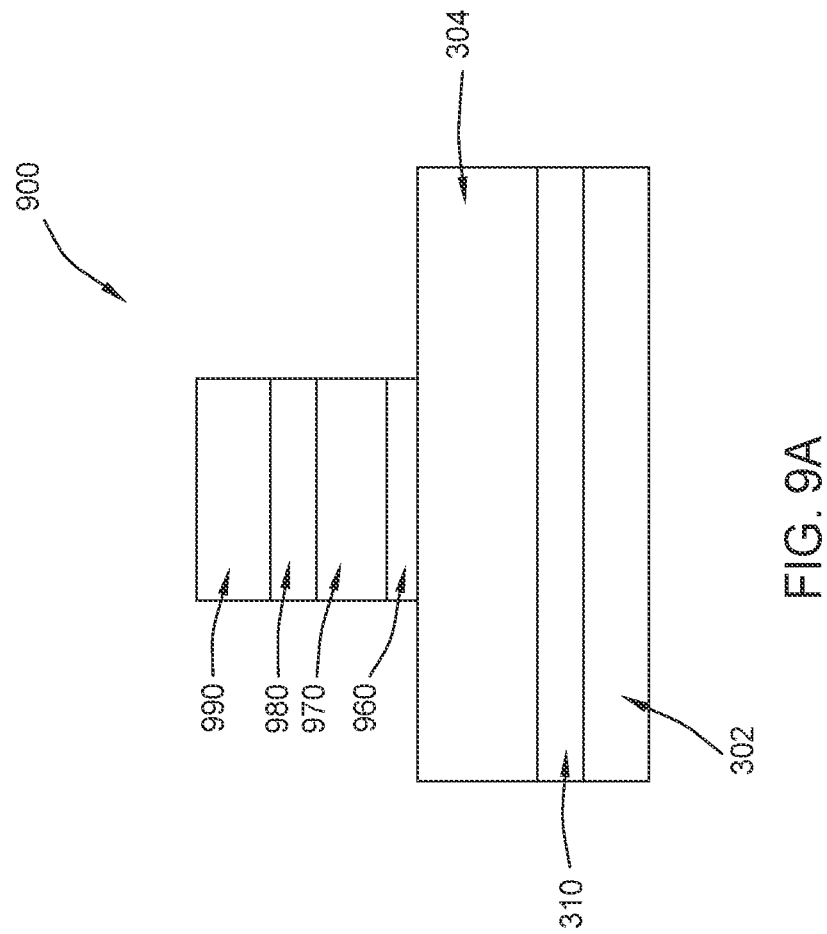
FIG. 9A is a schematic cross-sectional view of a SOT device for use in a microwave-assisted magnetic recording (MAMR) write head.

FIG. 9A is a schematic cross-sectional view of a SOT device 900 for use in a microwave-assisted magnetic recording (MAMR) write head, such as the MAMR write head of the drive 100 of FIG. 1 or other suitable magnetic media drives. The SOT device 900 comprises a TI modulation layer 304 comprising BiSb having a (012) crystal orientation and a dopant or clusters of atoms comprising a carbide, a nitride, an oxide, or a composite ceramic material formed disposed over a buffer layer 310 formed over a substrate 302, such as the TI modulation layer 304 and the buffer layer 310 of FIGS. 3A-6B. A spin torque layer (STL) 970 is formed over the TI modulation layer 304. The STL 970 comprises a ferromagnetic material such as one or more layers of CoFe, CoIr, NiFe, and CoFeX alloy wherein X=B, Ta, Re, or Ir.

In certain embodiments, an electrical current shunt block layer 960 is disposed between the TI modulation layer 304 and the STL 970. The electrical current shunt blocking layer 960 reduces electrical current from flowing from the TI modulation layer 304 to the STL 970 but allows spin orbital coupling of the TI modulation layer 304 and the STL 970. In certain embodiments, the electrical current shunt blocking layer 960 comprises a magnetic material which provides greater spin orbital coupling between the TI modulation layer 304 and the STL 970 than a non-magnetic material. In certain embodiments, the electrical current shunt blocking layer 960 comprises a magnetic material of FeCo, FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 960 is formed to a thickness from about 10 Å to about 100 Å. In certain aspects, an electrical current shunt blocking layer 960 having a thickness of over 100 A may reduce spin orbital coupling of the TI modulation layer 304 and the STL 970. In certain aspects, an electrical current shunt blocking layer having a thickness of less than 10 A may not sufficiently reduce electrical current from TI modulation layer 304 to the STL 970.

In certain embodiments, additional layers are formed over the STL 970 such as a spacer layer 980 and a pinning layer 990. The pinning layer 990 can partially pin the STL 970. The pinning layer 990 comprises a single or multiple layers of PtMn, NiMn, IrMn, IrMnCr, CrMnPt, FeMn, other antiferromagnetic materials, or combinations thereof. The spacer layer 980 comprises single or multiple layers of magnesium oxide, aluminum oxide, other non-magnetic materials, or combinations thereof.

Figure 9C:
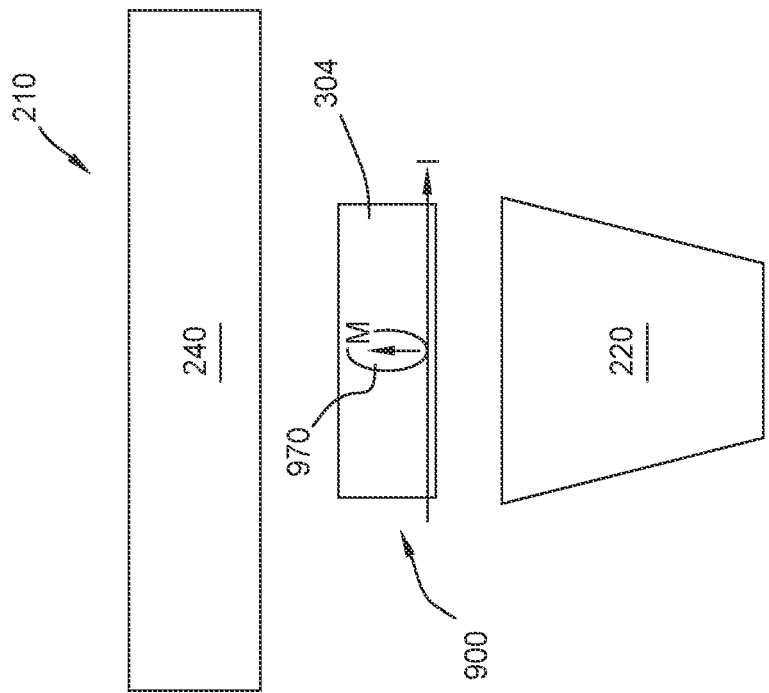
FIGS. 9B-9C are schematic MFS views of certain embodiments of a portion of a MAMR write head with the SOT device of FIG. 9A.
Figure 9B:
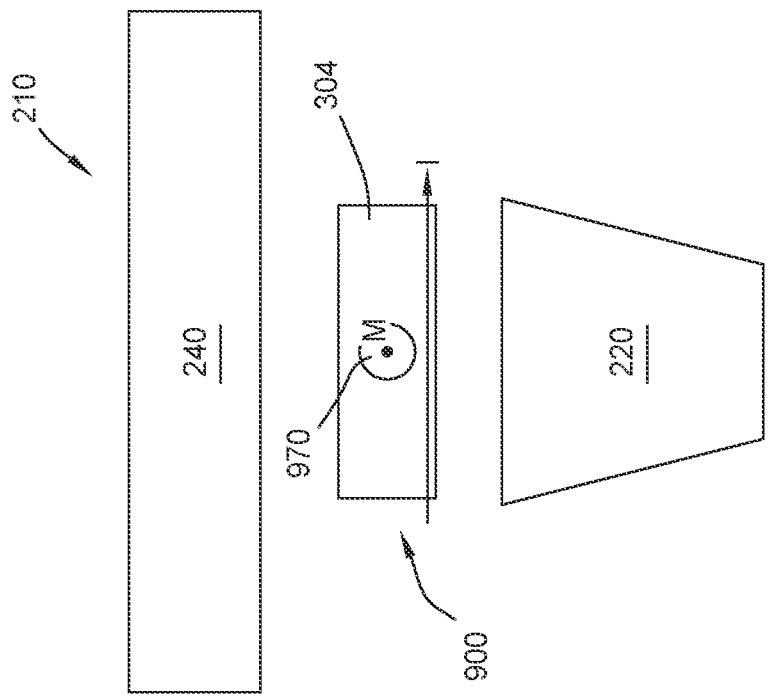

FIGS. 9B-9C are schematic MFS views of certain embodiments of a portion of a MAMR write head 210 with a SOT device 900 of FIG. 9A. The MAMR write head 210 can be the write head FIG. 2 or other suitable write heads in the drive 100 of FIG. 1 or other suitable magnetic media drives such as tape drives. The MAMR write head 210 includes a main pole 220 and a trailing shield 240 in a track direction. The SOT device 900 is disposed in a gap between the main pole and the trailing shield 240.

During operation, charge current through a TI modulation layer 304 acting as a spin Hall layer generates a spin current in the BiSb layer. The spin orbital coupling of the BiSb layer and a spin torque layer (STL) 970 causes switching or precession of magnetization of the STL 970 by the spin orbital coupling of the spin current from the TI modulation layer 304. Switching or precession of the magnetization of the STL 970 can generate an assisting AC field to the write field. Energy assisted write heads based on SOT have multiple times greater power efficiency in comparison to MAMR write heads based on spin transfer torque. As shown in FIG. 9B, an easy axis of a magnetization direction of the STL 970 is perpendicular to the MFS from shape anisotropy of the STL 970, from the pinning layer 990 of FIG. 9A, and/or from hard bias elements proximate the STL 970. As shown in FIG. 9C, an easy axis of a magnetization direction of the STL 970 is parallel to the MFS from shape anisotropy of the STL 970, from the pinning layer 990 of FIG. 9A, and/or from hard bias elements proximate the STL 970.

FIG. 10 is a schematic cross-sectional view of a SOT MTJ 1001 used as a magnetoresistive random-access memory (MRAM) device 1000. The MRAM device 1000 comprises a reference layer (RL) 1010, a spacer layer 1020 disposed over the RL 1010, a recording layer 1030 disposed over the spacer layer 1020, a buffer layer 310 over an electrical current shunt block layer 1040 disposed over the recording layer 1030, and a TI modulation layer 304 comprising BiSb having a (012) crystal orientation and a dopant or clusters of atoms comprising a carbide, a nitride, an oxide, or a composite ceramic material disposed over the buffer layer 310. The TI modulation layer 304 and the buffer layer 310 may be the TI modulation layer 304 and the buffer layer 310 of FIGS. 3A-6B.

The RL 1010 comprises single or multiple layers of CoFe, other ferromagnetic materials, or combinations thereof. The spacer layer 1020 comprises single or multiple layers of magnesium oxide, aluminum oxide, other dielectric materials, or combinations thereof. The recording layer 1030 comprises single or multiple layers of CoFe, NiFe, other ferromagnetic materials, or combinations thereof.

As noted above, in certain embodiments, the electrical current shunt block layer 1040 is disposed between the buffer layer 310 and the recording layer 1030. The electrical current shunt blocking layer 1040 reduces electrical current from flowing from the TI modulation layer 304 to the recording layer 1030 but allows spin orbital coupling of the TI modulation layer 304 and the recording layer 1030. For example, writing to the MRAM device can be enabled by the spin orbital coupling of the BiSb layer and the recording layer 1030, which enables switching of magnetization of the recording layer 1030 by the spin orbital coupling of the spin current from the TI modulation layer 304. In certain embodiments, the electrical current shunt blocking layer 1040 comprises a magnetic material which provides greater spin orbital coupling between the TI modulation layer 304 and the recording layer 1030 than a non-magnetic material. In certain embodiments, the electrical current shunt blocking layer 1040 comprises a magnetic material of FeCoM, FeCoMO, FeCoMMeO, FeCoM/MeO stack, FeCoMN-iMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 1000 of FIG. 10 may include other layers, such as pinning layers, pinning structures (e.g., a synthetic antiferromagnetic (SAF) pinned structure), electrodes, gates, and other structures. Other MRAM devices besides the structure of FIG. 10 can be formed utilizing a TI modulation layer 304 with a (012) orientation over a buffer layer 310 to form a SOT MTJ 1001.

By doping the TI lamellae layers comprising BiSb having a (012) crystal orientation with a carbide, a nitride, an oxide, or a composite ceramic material, the melting point of the dopants or clusters of atoms may be substantially reduced, enabling the MTJ SOT devices to operate at higher temperatures while further reducing migration of the Sb within the TI lamellae layers. The clusters of atoms migrate to the grain boundaries of the BiSb lamellae of the TI lamellae layers, resulting in the grain boundary strengthening against thermal movement while providing an additional barrier against Sb migration. Doping the TI lamellae layers with a carbide, a nitride, an oxide, or a composite ceramic material reduces BiSbX grain growth in the TI lamellae layers and provides epitaxial growth with BiSb (012) textured layer. Because of the high or strong ionic or covalent chemically bonded nature of the dopant or clusters of atoms, the dopant or clusters of atoms will have minimal chemical interaction with the BiSbX alloy of the TI lamellae layers, thereby provide an interfacial layer barrier against Sb migration while reducing grain growth in the MTJ SOT devices and improving roughness.

Furthermore, higher process temperatures can be reached using low melting point TI materials like BiSbX by using low band gap or conductive ceramics, or ceramics with metallic bonding, as glass forming grain boundary segregates with wide grain boundaries, along with ceramic-TI lamination layers, composition modulation layers, and growth texturing layers to be defined later, to maintain the growth and (012) texture of TI materials to match MRAM or SOT device interlayer or buffer layers.

In one embodiment, a spin-orbit torque (SOT) magnetic tunnel junction (MTJ) device comprises a topological insulator (TI) modulation layer, the TI modulation layer comprising: a plurality of bismuth or bismuth-rich bismuth antimony (BiSb) composition modulation layers comprising bismuth in an atomic percent of about 96% to about 100%, a plurality of TI lamellae layers, wherein the TI lamellae layers are co-deposited with clusters of atoms, the clusters of atoms comprising a carbide, a nitride, an oxide, or a composite ceramic material, and wherein the clusters of atoms are configured to have a grain boundary glass forming temperature of less than about 400° C. at a grain boundary with a bulk melting temperature less than about 1400° C., and a plurality of texturing layers.

The TI lamellae layers comprise bismuth antimony (BiSb) having a crystal orientation of (012). The composite ceramic material has a melting temperature less than about 1400° C. The texturing layers are selected from the group consisting of: an amorphous material comprising covalently bonded carbide, oxide, or nitride, a face centered cubic (fcc) material, a tetragonal material, and a body centered cubic (bcc) material. The SOT MTJ device further comprises a buffer layer, wherein the TI modulation layer is disposed over the buffer layer, and an interlayer disposed on the TI modulation layer. A first bismuth or bismuth-rich BiSb composition modulation layer of the plurality of bismuth or bismuth-rich BiSb composition modulation layers is disposed in contact with the buffer layer, and a second bismuth or bismuth-rich BiSb composition modulation layer of the plurality of bismuth or bismuth-rich BiSb composition modulation layers is disposed in contact with the interlayer.

The carbide material is selected from the group consisting of: ScC, TiC, NbC, ZrC, HfC, TaC, WC, SiC, and composite combinations thereof with one or more elements selected from the group consisting of: W, Al, and Si. The oxide material is selected from the group consisting of: FeO, CoC, ZrO, MgO, TiO, ZnO, and composite combinations thereof with one or more elements selected from the group consisting of: W, Al, and Si. The nitride material is selected from the group consisting of: ScN, TiN, NbN, ZrN, HfN, TaN, GaN, FeN, and composite combinations thereof with one or more elements selected from the group consisting of: W, Al, and Si. The composite ceramic material is selected from the group consisting of: Bi, Pb, Ga, Sc, Ti, V, Cr, Mn, Fe, Zr, Nb, Mo, In, Ir, Ru, V, Os, Rh, Pd, WV, CrV, CrNb, Ge, ZnNb, ZnTa, Co, Mg, Sn, Sb, Te, Hf, Ta, W, oxides thereof, nitrides thereof, carbides thereof, and alloys thereof. A magnetoresistive random-access memory device comprises the SOT MTJ.

In another embodiment, a SOT MTJ device comprises a TI modulation layer, the TI modulation layer comprising: a plurality of bismuth or bismuth-rich composition modulation layers comprising bismuth in an atomic percent of about 96% to about 100%, a plurality of TI lamellae layers comprising bismuth antimony (BiSb) having a crystal orientation of (012), wherein the TI lamellae layers are co-deposited with clusters of atoms, the clusters of atoms comprising a carbide, a nitride, an oxide, or a composite ceramic material, and a plurality of texturing layers, wherein each texturing layer is alternatingly layered between a TI lamellae layer.

The TI lamellae layers are co-deposited with the clusters of atoms in a modulated orientation. The TI lamellae layers are co-deposited with the clusters of atoms in an edge orientation. The TI lamellae layers are co-deposited with the clusters of atoms in a uniformly or non-uniformly distributed orientation. The carbide material is selected from the group consisting of: ScC, TiC, NbC, ZrC, HfC, TaC, WC, SiC, and composite combinations thereof with one or more elements selected from the group consisting of: W, Al, and Si. The nitride material is selected from the group consisting of: ScN, TiN, NbN, ZrN, HfN, TaN, GaN, FeN, and composite combinations thereof with one or more elements selected from the group consisting of: W, Al, and Si. The oxide material is selected from the group consisting of: FeO, CoC, ZrO, MgO, TiO, ZnO, and composite combinations thereof with one or more elements selected from the group consisting of: W, Al, and Si. A magnetoresistive random-access memory device comprises the SOT MTJ.

In yet another embodiment, a SOT MTJ device comprises a buffer layer, an interlayer disposed over the buffer layer, and a TI modulation layer disposed between the buffer layer and the interlayer, the TI modulation layer comprising: a plurality of bismuth or bismuth-rich bismuth antimony (BiSb) composition modulation layers comprising bismuth in an atomic percent of about 96% to about 100%, a plurality of TI lamellae layers comprising BiSb having a crystal orientation of (012), wherein the TI lamellae layers are co-deposited with clusters of atoms, the clusters of atoms comprising a carbide, a nitride, an oxide, or a composite ceramic material, wherein each TI lamellae layer is disposed in contact with two bismuth or bismuth-rich BiSb composition modulation layers, and a plurality of texturing layers, wherein each texturing layer is disposed in contact with two bismuth-rich composition modulation layers.

The carbide material is selected from the group consisting of: ScC, TiC, NbC, ZrC, HfC, TaC, WC, SiC, and composite combinations thereof with one or more elements selected from the group consisting of: W, Al, and Si. The nitride material is selected from the group consisting of: ScN, TiN, NbN, ZrN, HfN, TaN, GaN, FeN, and composite combinations thereof with one or more elements selected from the group consisting of: W, Al, and Si. The oxide material is selected from the group consisting of: FeO, CoC, ZrO, MgO, TiO, ZnO, and composite combinations thereof with one or more elements selected from the group consisting of: W, Al, and Si. The composite ceramic material is selected from the group consisting of: Bi, Pb, Ga, Sc, Ti, V, Cr, Mn, Fe, Zr, Nb, Mo, In, Ir, Ru, V, Os, Rh, Pd, WV, CrV, CrNb, Ge, ZnNb, ZnTa, Co, Mg, Sn, Sb, Te, Hf, Ta, W, oxides thereof, nitrides thereof, carbides thereof, and alloys thereof. A first bismuth or bismuth-rich BiSb composition modulation layer of the plurality of bismuth or bismuth-rich BiSb composition modulation layers is disposed in contact with the buffer layer, and a second bismuth or bismuth-rich BiSb composition modulation layer of the plurality of bismuth or bismuth-rich BiSb composition modulation layers is disposed in contact with the interlayer.

The interlayer comprises one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, a textured fcc (111) material, a textured hcp (002) material, an amorphous material comprising covalently bonded carbide, oxide, or nitride, an amorphous metallic material, and a layered combination of one or more of any of the preceding materials. The buffer layer comprises one or more sublayers comprising one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, a textured fcc (111) material, a textured hcp (002) material, an amorphous metallic material, an amorphous material comprising covalently bonded carbide, oxide, or nitride, and a layered combination of one or more of any of the preceding materials. A magnetoresistive random-access memory device comprises the SOT MTJ.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
   a topological insulator (TI) modulation multilayer, the TI modulation multilayer comprising an alternating stack, the alternating stack repeating one or more times, wherein the alternating stack comprises:
   one or more texturing layers; and
   one or more TI lamellae layers comprising BiSb and clusters of atoms, the clusters of atoms comprising a carbide, a nitride, an oxide, or a composite ceramic material.

2. The SOT device of claim 1, wherein the BiSb of the one or more TI lamellae layers has a crystal orientation of (012), and wherein the clusters of atoms are configured to have a grain boundary glass forming temperature of less than about 400° C. at a grain boundary with a bulk melting temperature less than about 1400° C.

3. The SOT device of claim 1, wherein:
   the carbide is selected from the group consisting of: ScC, TiC, NbC, ZrC, HfC, TaC, WC, SiC, and composite combinations thereof with one or more elements selected from the group consisting of: W, Al, and Si,
   the oxide is selected from the group consisting of: FeO, CoC, ZrO, MgO, TiO, ZnO, and composite combinations thereof with one or more elements selected from the group consisting of: W, Al, and Si,
   the nitride is selected from the group consisting of: ScN, TiN, NbN, ZrN, HfN, TaN, GaN, FeN, and composite combinations thereof with one or more elements selected from the group consisting of: W, Al, and Si, and
   wherein the composite ceramic material is selected from the group consisting of: Bi, Pb, Ga, Sc, Ti, V, Cr, Mn, Fe, Zr, Nb, Mo, In, Ir, Ru, V, Os, Rh, Pd, WV, CrV, CrNb, Ge, ZnNb, ZnTa, Co, Mg, Sn, Sb, Te, Hf, Ta, W, oxides thereof, nitrides thereof, carbides thereof, and alloys thereof.

4. The SOT device of claim 1, wherein the TI modulation multilayer further comprises one or more bismuth (Bi) or bismuth-rich bismuth antimony (BiSb) composition modulation layers comprising bismuth in an atomic percent of greater than or equal to about 96%.

5. The SOT device of claim 4, wherein the alternating stack comprises:

a first TI lamellae layer of the one or more TI lamellae layers; and
a first texturing layer of the one or more texturing layers disposed in contact with the first TI lamellae layer, wherein the alternating stack is disposed on a first Bi or BiSb composition modulation layer of the one or more Bi or BiSb composition modulation layers such that the first TI lamellae layer is disposed in contact with the first Bi or BiSb composition modulation layer.

6. The SOT device of claim 4, wherein the alternating stack comprises:
a first Bi or BiSb composition modulation layer of the one or more Bi or BiSb composition modulation layers;
a first TI lamellae layer of the one or more TI lamellae layers disposed on the first Bi or BiSb composition modulation layer;
a second Bi or BiSb composition modulation layer of the one or more Bi or BiSb composition modulation layers disposed on the first TI lamellae layer; and
a first texturing layer of the one or more texturing layer disposed on the second Bi or Bi Sb composition modulation layer.

7. The SOT device of claim 1, wherein the one or more TI lamellae layers are co-deposited with the clusters of atoms in a modulated orientation.

8. The SOT device of claim 1, wherein the one or more TI lamellae layers are co-deposited with the clusters of atoms in an edge orientation.

9. The SOT device of claim 1, wherein the one or more TI lamellae layers are co-deposited with the clusters of atoms in a uniformly or non-uniformly distributed orientation.

10. A magnetic recording device comprising a magnetic recording head, the magnetic recording head comprising:
a spin-orbit torque (SOT) device, comprising:
a topological insulator (TI) modulation multilayer, the TI modulation multilayer comprising an alternating stack, the alternating stack repeating one or more times, wherein the alternating stack comprises:
one or more texturing layers; and
one or more TI lamellae layers comprising BiSb and clusters of atoms, the clusters of atoms comprising a carbide, a nitride, an oxide, or a composite ceramic material.

11. A magneto-resistive memory comprising:
a spin-orbit torque (SOT) device, comprising:
a topological insulator (TI) modulation multilayer, the TI modulation multilayer comprising an alternating stack, the alternating stack repeating one or more times, wherein the alternating stack comprises:
one or more texturing layers; and
one or more TI lamellae layers comprising BiSb and clusters of atoms, the clusters of atoms comprising a carbide, a nitride, an oxide, or a composite ceramic material.

12. A spin-orbit torque (SOT) device, comprising:
a topological insulator (TI) modulation multilayer, the TI modulation multilayer comprising:
two or more bismuth (Bi) or bismuth-rich bismuth antimony (BiSb) composition modulation layers comprising bismuth in an atomic percent greater than or equal to about 96%;
a plurality of TI lamellae layers comprising BiSb having a crystal orientation of (012) and clusters of atoms, the clusters of atoms comprising a carbide, a nitride, an oxide, or a composite ceramic material; and
one or more texturing layers.

13. The SOT device of claim 12, wherein a first TI lamellae layer of the plurality of TI lamellae layers is disposed in contact with a first Bi or BiSb composition modulation layer of the two or more Bi or BiSb composition modulation layers and a first texturing layer of the one or more texturing layers.

14. The SOT device of claim 12, wherein a first TI lamellae layer of the plurality of TI lamellae layers is disposed in contact with a first texturing layer of the one or more texturing layers and a second texturing layer of the one or more texturing layers.

15. The SOT device of claim 12, wherein a first TI lamellae layer of the plurality of TI lamellae layers is disposed in contact with a first Bi or BiSb composition modulation layer of the two or more Bi or BiSb composition modulation layers and a second Bi or BiSb composition modulation layer of the two or more Bi or BiSb composition modulation layers.

16. The SOT device of claim 12, wherein a first texturing layer of the one or more texturing layers is disposed in contact with a first Bi or BiSb composition modulation layer of the two or more Bi or BiSb composition modulation layers and a second Bi or BiSb composition modulation layer of the two or more Bi or BiSb composition modulation layers.

17. A magnetic recording device comprising a magnetic recording head, the magnetic recording head comprising:
a spin-orbit torque (SOT) device, comprising:
a topological insulator (TI) modulation multilayer, the TI modulation multilayer comprising:
two or more bismuth (Bi) or bismuth-rich bismuth antimony (BiSb) composition modulation layers comprising bismuth in an atomic percent greater than or equal to about 96%;
a plurality of TI lamellae layers comprising BiSb having a crystal orientation of (012) and clusters of atoms, the clusters of atoms comprising a carbide, a nitride, an oxide, or a composite ceramic material; and
one or more texturing layers.

18. A magneto-resistive memory comprising:
a spin-orbit torque (SOT) device, comprising:
a topological insulator (TI) modulation multilayer, the TI modulation multilayer comprising:
two or more bismuth (Bi) or bismuth-rich bismuth antimony (BiSb) composition modulation layers comprising bismuth in an atomic percent greater than or equal to about 96%;
a plurality of TI lamellae layers comprising BiSb having a crystal orientation of (012) and clusters of atoms, the clusters of atoms comprising a carbide, a nitride, an oxide, or a composite ceramic material; and
one or more texturing layers.

19. A spin-orbit torque (SOT) device, comprising:
a topological insulator (TI) modulation multilayer, the TI modulation multilayer comprising:
a plurality of bismuth (Bi) or bismuth-rich bismuth antimony (BiSb) composition modulation layers comprising bismuth in an atomic percent of about 96% to about 100%; and
one or more alternating stacks, the one or more alternating stacks comprising:
a first TI lamellae layer comprising BiSb having a crystal orientation of (012) and clusters of atoms, the clusters of atoms comprising a carbide, a nitride, an oxide, or a composite ceramic material; and a first texturing layer disposed over the first TI lamellae layer, the first texturing layer being selected from the group consisting of: an amorphous material comprising covalently bonded carbide, oxide, or nitride, a face centered cubic (fcc) material, a tetragonal material, a body centered cubic (bcc) material, and a metallic amorphous material.

20. The SOT device of claim 19, wherein the first texturing layer is disposed on and in contact with the first TI lamellae layer.

21. The SOT device of claim 20, wherein the one or more alternating stacks are disposed between a first Bi or BiSb composition modulation layer of the plurality of Bi or BiSb composition modulation layers and a second Bi or BiSb composition modulation layer of the plurality of Bi or BiSb composition modulation layers.

22. The SOT device of claim 19, wherein the one or more alternating stacks further comprise a first Bi or BiSb composition modulation layer of the plurality of Bi or BiSb composition modulation layers and a second Bi or BiSb composition modulation layer of the plurality of Bi or BiSb composition modulation layers, and wherein the first TI lamellae layer is disposed on the first Bi or BiSb composition modulation layer, the second Bi or BiSb composition modulation layer is disposed on the first TI lamellae layer, and the first texturing layer is disposed on the second Bi or BiSb composition modulation layer.

23. The SOT device of claim 19, further comprising:
a buffer layer; and
an interlayer disposed over the buffer layer, wherein the TI modulation multilayer is disposed between and in contact with the buffer layer and the interlayer.

24. A magnetic recording device comprising a magnetic recording head, the magnetic recording head comprising:
a spin-orbit torque (SOT) device, comprising:
a topological insulator (TI) modulation multilayer, the TI modulation multilayer comprising:
a plurality of bismuth (Bi) or bismuth-rich bismuth antimony (BiSb) composition modulation layers comprising bismuth in an atomic percent of about 96% to about 100%; and
one or more alternating stacks, the one or more alternating stacks comprising:
a first TI lamellae layer comprising BiSb having a crystal orientation of (012) and clusters of atoms, the clusters of atoms comprising a carbide, a nitride, an oxide, or a composite ceramic material; and
a first texturing layer disposed over the first TI lamellae layer, the first texturing layer being selected from the group consisting of:
an amorphous material comprising covalently bonded carbide, oxide, or nitride, a face centered cubic (fcc) material, a tetragonal material, a body centered cubic (bcc) material, and a metallic amorphous material.

25. A magneto-resistive memory comprising:
a spin-orbit torque (SOT) device, comprising:
a topological insulator (TI) modulation multilayer, the TI modulation multilayer comprising:
a plurality of bismuth (Bi) or bismuth-rich bismuth antimony (BiSb) composition modulation layers comprising bismuth in an atomic percent of about 96% to about 100%; and
one or more alternating stacks, the one or more alternating stacks comprising:
a first TI lamellae layer comprising BiSb having a crystal orientation of (012) and clusters of atoms, the clusters of atoms comprising a carbide, a nitride, an oxide, or a composite ceramic material; and
a first texturing layer disposed over the first TI lamellae layer, the first texturing layer being selected from the group consisting of:
an amorphous material comprising covalently bonded carbide, oxide, or nitride, a face centered cubic (fcc) material, a tetragonal material, a body centered cubic (bcc) material, and a metallic amorphous material.

* * * * *